United States Patent
Noda et al.

(10) Patent No.: US 7,446,742 B2
(45) Date of Patent: Nov. 4, 2008

(54) LIGHT EMITTING DEVICE

(75) Inventors: Takeshi Noda, Kanagawa (JP); Ryota Fukumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 676 days.

(21) Appl. No.: 11/041,264

(22) Filed: Jan. 25, 2005

(65) Prior Publication Data

US 2005/0168415 A1  Aug. 4, 2005

(30) Foreign Application Priority Data

Jan. 30, 2004  (JP) ............... 2004-024285

(51) Int. Cl.
    *G09G 3/30*  (2006.01)
(52) U.S. Cl. .............. 345/76; 345/36; 345/77; 345/204; 345/205
(58) Field of Classification Search .......... 345/76–77, 345/36, 204–205
    See application file for complete search history.

(56) References Cited

U.S. PATENT DOCUMENTS

| | | | |
|---|---|---|---|
| 6,207,969 B1 | 3/2001 | Yamazaki | |
| 6,246,384 B1 | 6/2001 | Sano | |
| 6,730,966 B2 | 5/2004 | Koyama | |
| 6,982,462 B2 | 1/2006 | Koyama | |
| 7,122,969 B2 | 10/2006 | Fukumoto et al. | |
| 7,141,934 B2 | 11/2006 | Osame et al. | |
| 7,173,586 B2 | 2/2007 | Osame et al. | |
| 7,187,350 B2 | 3/2007 | Yoshida | |
| 7,256,774 B1 * | 8/2007 | Senda et al. | 345/204 |
| 2001/0002703 A1 | 6/2001 | Koyama | |
| 2002/0113760 A1 | 8/2002 | Kimura | |
| 2002/0135312 A1 | 9/2002 | Koyama | |
| 2002/0196389 A1 | 12/2002 | Koyama | |
| 2003/0067424 A1 | 4/2003 | Akimoto et al. | |
| 2003/0090447 A1 | 5/2003 | Kimura | |
| 2003/0164685 A1 | 9/2003 | Inukai | |
| 2003/0222589 A1 | 12/2003 | Osame et al. | |
| 2004/0251953 A1 | 12/2004 | Yamazaki et al. | |
| 2004/0252565 A1 | 12/2004 | Yamazaki et al. | |
| 2004/0257353 A1 * | 12/2004 | Imamura et al. | 345/204 |
| 2005/0012686 A1 | 1/2005 | Osame et al. | |
| 2006/0033161 A1 | 2/2006 | Koyama | |

* cited by examiner

*Primary Examiner*—Richard Hjerpe
*Assistant Examiner*—Leonid Shapiro
(74) *Attorney, Agent, or Firm*—Fish & Richardson P.C.

(57) ABSTRACT

A light emitting device is provided where an area occupied by capacitors is decreased, luminance variations of light emitting elements caused by characteristics variations or fluctuations of the gate voltage Vgs of driving TFTs can be suppressed. Each of multiple pixels includes a light emitting element, a first transistor for determining a current value supplied thereto, a second transistor for selecting emission/non-emission thereof according to video signals, a first power supply line, and a second power supply line shared by the multiple pixels. In addition, a compensation circuit is provided each of which includes a third transistor whose gate and drain are connected to the second power supply line, and a fourth transistor for controlling the connection between a third power supply line and the gate and drain of the third transistor. The first and second transistors are connected in series between the light emitting element and the first power supply line, and the gate of the first transistor is connected to the second power supply line.

14 Claims, 18 Drawing Sheets

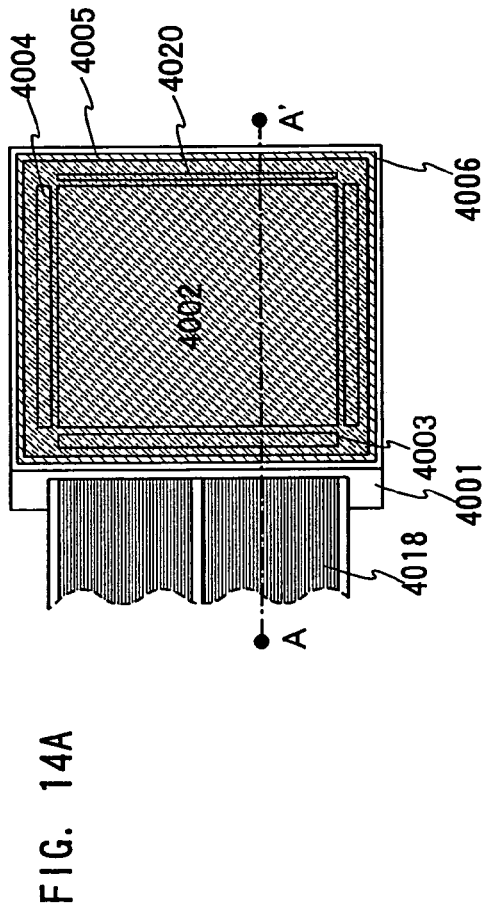
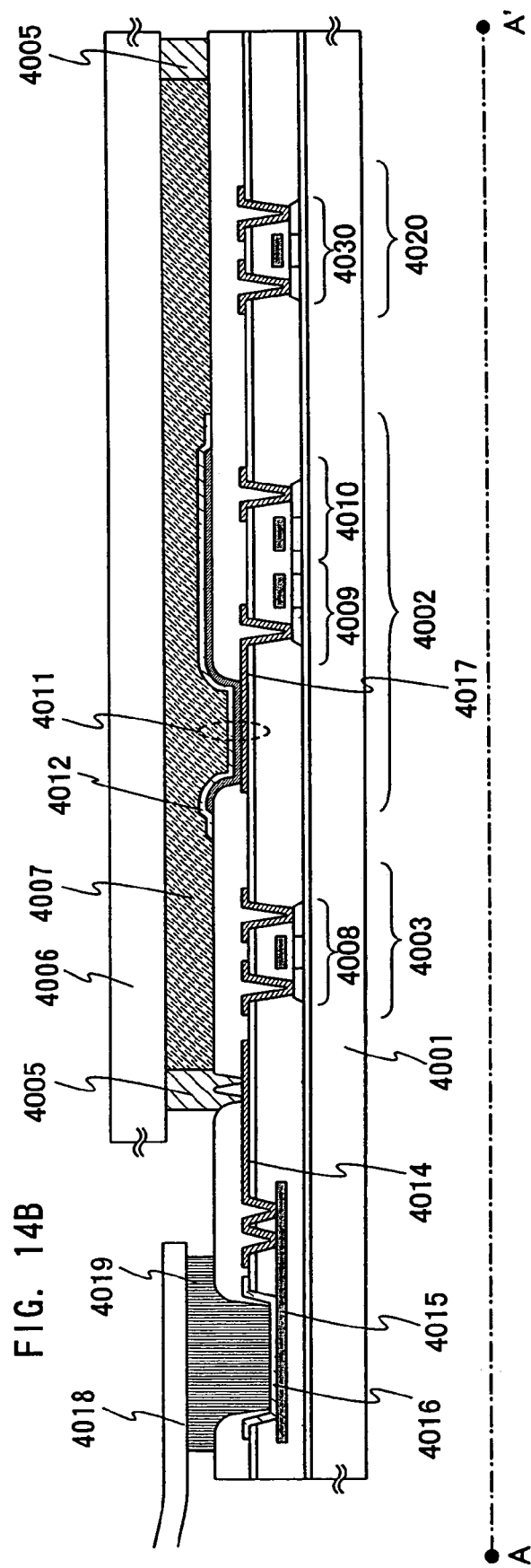
FIG. 14A
FIG. 14B

LIGHT EMITTING DEVICE

BACKGROUND OF THE INVENTION

1. Field of the Invention

The present invention relates to a light emitting device comprising a plurality of pixels each of which includes a light emitting element and a means for supplying current to the light emitting element.

2. Description of the Related Art

A light emitting element can exhibit highly visible light as it is a self-luminous type. Also, it is suitable for slimming of a display device and can provide a wide viewing angle differently from liquid crystal display devices (LCDs) which require backlight. Therefore, a light emitting device formed by using light emitting elements is attracting attentions as a substitute for CRTs and LCDs, and is now being applied to various electronic devices such as mobile phones and digital still cameras. Among them, an active matrix light emitting device which is actively developed in recent years typically comprises pixels each of which includes at least a light emitting element, a TFT for controlling an input of a video signal to the pixel (switching TFT) and a TFT for controlling a current value supplied to the light emitting element (driving TFT) although the configuration of the pixel differs among manufacturers.

A TFT (Thin Film Transistor) formed by using a polycrystalline semiconductor film has a mobility of 100 or more times higher than a TFT formed by using an amorphous semiconductor film, and it has the advantage that when constructing a light emitting device, a pixel portion and its peripheral driver circuit can be formed integrally on the same substrate. The polycrystalline semiconductor film can be formed over an inexpensive glass substrate by using laser annealing. However, energy of laser light outputted from an oscillator has flickers of at least about several % due to various factors, which prevent uniform crystallization of the semiconductor film. When the uniform crystallization is disturbed, which in turn causes variations in crystallinity of a polycrystalline semiconductor film, characteristics (for example, on-current, mobility, threshold voltage and the like) of a TFT using the polycrystalline semiconductor film as its active layer vary. Accordingly, when a polycrystalline semiconductor film formed by laser annealing is used as a driving transistor, characteristic variations of the driving transistor cause luminance variations of a light emitting element.

When a circuit for compensating characteristic variations of the driving transistor is provided in each pixel, luminance variations of a light emitting element resulting from such characteristic variations can be suppressed. However, since the number of TFTs in the pixel is disadvantageously increased when adopting such a method, high resolution cannot be achieved.

In addition, there is another problem that luminance of a light emitting element decays in accordance with the degradation of electroluminescent materials used for the light emitting element. In this case, luminance decay of the light emitting element can be suppressed by supplying constant current to the light emitting element more efficiently than by supplying constant voltage to the light emitting element. However, even when the current supplied to the light emitting element is constant, luminance thereof decays in accordance with the degradation of the electroluminescent materials. The degree of degradation depends on the time that the light emitting element emits light or the amount of current flowing to the light emitting element. Therefore, when a gray scale of each pixel differs according to a displayed image, degradation of the light emitting element in each pixel differs accordingly, which causes luminance variations.

In such a case, the luminance decay due to the degradation of the electroluminescent materials can be suppressed to a certain degree by operating the driving TFT in the saturation region. However, since a value of a drain current of a TFT which operates in the saturation region easily fluctuates by a slight fluctuation of the gate-source voltage (hereinafter referred to as gate voltage) Vgs, luminance of the light emitting element easily fluctuates accordingly. Therefore, when operating the driving TFT in the saturation region, it is required that the gate voltage Vgs thereof do not fluctuate while the light emitting element emits light. However, when off-current of a switching TFT is large, the gate voltage Vgs of the driving TFT easily fluctuates in accordance with the potential change of a video signal which is inputted to other pixels. In order to prevent such fluctuation of the gate voltage Vgs, it is required that a capacitor for holding the gate voltage of the TFT have a high capacity or the off-current of the switching TFT be suppressed low. However, in order to optimize the manufacturing steps of TFTs so as to suppress the off-current of the switching TFT low while increasing the on-current so as to charge a large capacitance in a predetermined period, high cost and long time are required disadvantageously. In addition, an increase of the area occupied by the capacitor is undesirable since it will produce a leak current between opposite electrodes of the capacitor due to dust and the like more often, which leads to lower the yield. Further, there is still another problem that the gate voltage Vgs of the driving TFT easily fluctuates along with the switching operation of other TFTs, a potential fluctuation of a signal line or a scan line and the like due to the parasitic capacitance of the gate electrode.

SUMMARY OF THE INVENTION

In view of the foregoing problems, the invention provides a light emitting device where an area occupied by a capacitor is decreased, luminance variations of light emitting elements caused by characteristics variations or fluctuations of the gate voltage Vgs of driving TFTs can be suppressed even by adopting TFTs manufactured by a conventional process, and luminance decay of the light emitting elements or luminance unevenness due to degradation of electroluminescent materials can be suppressed.

According to the invention, a transistor having a switching function (current controlling transistor) is connected in series to a transistor for determining a current value supplied to a light emitting element (driving transistor). By supplying to the gate of the driving transistor a potential which allows the driving transistor to be turned ON, the driving transistor is set ready to constantly flow a current therethrough. The current controlling transistor is operated in the linear region, and the gate potential thereof is controlled by a video signal inputted to the pixel. It is desirable that the driving transistor be operated in the saturation region, and the drain current thereof is utilized to control the luminance of the light emitting element.

When the current controlling transistor is operated in the linear region, the source-drain voltage (drain voltage) Vds thereof is decreased to an extremely low level relatively to the voltage Vel applied to the light emitting element, thus a slight fluctuation of the gate voltage Vgs becomes less likely to affect the current flowing to the light emitting element. Accordingly, it becomes possible that the current flowing to the light emitting element does not fluctuate easily even without increasing a capacity of the capacitor provided between the gate and the source of the current controlling transistor or suppressing the off-current of the switching transistor for controlling an input of a video signal to the pixel. The current flowing to the light emitting element is not even affected by the parasitic capacitance of the gate of the current controlling transistor either. The current controlling transistor only selects whether to supply a current or not to the light emitting element, and the current value flowing to the light emitting element is determined by the driving transistor which operates in the saturation region.

According to the invention, a gate potential of the driving transistor operated in the saturation region is not controlled by a video signal, but is kept at the level which allows the driving transistor to be ON. The drain current of the driving transistor which operates in the saturation region easily fluctuates by a slight fluctuation of the gate voltage Vgs thereof, however, according to the invention, the gate voltage of the driving transistor can be fixed, thus the gate voltage Vgs does not fluctuate. Accordingly, the drain current of the driving transistor can be kept constant easily independently of the switching operation of the switching transistor, thus image quality can be enhanced significantly. Further, since process optimization is not required for suppressing the off-current of the transistor for controlling an input of a video signal to the pixel, manufacturing process of transistors can be simplified, which significantly contributes to a cost reduction and improvement in yield.

When the driving transistor is operated in the saturation region, the drain current thereof does not fluctuate by the drain-source voltage (hereinafter referred to as a drain voltage) Vds, but determined only by the Vgs, therefore, the value of the drain current can be kept constant relatively even when the Vds is decreased in accordance with the degradation of the light emitting element, instead of the Vel being increased. Accordingly, luminance decay of the light emitting element or luminance unevenness in accordance with the degradation of the electroluminescent materials can be suppressed.

In addition, according to the invention, a potential supplied to the gate of the driving transistor is compensated in accordance with the characteristics of a compensation transistor Specifically, a transistor whose gate and drain are connected to each other is used for compensation (hereinafter referred to as a compensation transistor), and a potential obtained by adding the threshold voltage of the compensation transistor to the power supply potential is supplied to the gate of the driving transistor. By making compensation for the potential supplied to the gate of the driving transistor in accordance with the threshold voltage, luminance variations due to variations in the threshold voltage can be suppressed. In particular, when operating the driving transistor in the saturation region, the ratio of |Vgs| to |Vth| is small, thus a current flowing to the light emitting element easily fluctuates due to the variations in the threshold voltage Vth. However, according to the invention, such luminance variations can be suppressed even when using the saturation region since the potential supplied to the gate of the driving transistor can be compensated in accordance with the threshold voltage.

Alternatively, the potential supplied to the gate of the driving transistor may be compensated not by supplying a potential obtained by adding the threshold voltage of the compensation transistor to the power supply potential, but by fixing the gate voltage Vgs of the compensation transistor so that the drain current of the compensation transistor can have a predetermined value, thereby supplying the potential to the gate of the driving transistor. In this case, the potential supplied to the gate of the driving transistor can be compensated inclusive of variations in the threshold voltage of the driving transistor as well as variations in other characteristics such as mobility which could fluctuate the value of the drain current.

Note that such potential compensation can be performed more accurately when the compensation transistor and the driving transistor have as similar characteristics as possible. Therefore, according to the invention, it is desirable that, in irradiating a semiconductor film used for a transistor with laser light, the region to be an active layer of the driving transistor and the region to be an active layer of the compensation transistor be located within the same beam spot. Note that in the case of irradiating laser light of a plurality of pulses to one spot, the aforementioned two regions are located within the same beam spot of at least one pulse. According to such structure, variations in crystallinity can be decreased between the active layers of the driving transistor and the compensation transistor provided correspondingly to the driving transistor, even when the output of laser light varies between pulses. Accordingly, the two transistors can obtain uniform characteristics, which enables a more accurate potential compensation.

According to the invention, a wiring for supplying a potential to the gate of the driving transistor is shared by a plurality of pixels. Therefore, a compensation transistor is not required to be formed per pixel, but only required to be formed correspondingly to the wiring for supplying a potential to the gate of each driving transistor.

In addition, the two transistors may be formed to have substantially the same L/W ratios (channel length-to-width ratios) so that the driving transistor and the compensation transistor provided correspondingly to the driving transistor can have uniform characteristics.

Note that the L of the driving transistor may be formed larger than the W thereof while the L of the current controlling transistor may be formed equal to or smaller than the W thereof. It is preferable that the L/W ratio of the driving transistor be 5 or more. By forming the L of the driving transistor larger than the W thereof, linearity of the drain current in the saturation region can be increased, which in turn can suppress luminance variations of a light emitting element in each pixel due to the characteristic variations of the driving transistor. Assuming that the channel length and the channel width of the driving transistor are L1 and W1 respectively, the channel length and the channel width of the current controlling transistor are L2 and W2 respectively, and L1/W1: L2/W2=X:1 is satisfied, X is desirably in the range of 5 to 6000. For example, L1/W1=500 μm/3 μm and L2/W2=3 μm/100 μm can be considered.

In this specification, light emitting element means an element whose luminance can be controlled by current or voltage. Specifically, it includes an OLED (Organic Light Emitting Diode), an electron source element (electron-emissive element) of an MIM type used for an FED (Field Emission Display) and the like.

OLED (Organic Light Emitting Diode) which is one of the light emitting elements comprises an anode, a cathode and a layer (hereinafter referred to as an electroluminescent layer) containing electroluminescent materials which can generate luminescence (electroluminescence) when an electronic field is applied thereto. The electroluminescent layer is interposed between the anode and the cathode, and includes a single or a plurality of layers. These layers may contain inorganic compounds. The luminescence generated in the electroluminescent layer includes luminescence that is generated when an excited singlet state returns to a ground state (fluorescence) and luminescence that is generated when an exited triplet state returns to a ground state (phosphorescence).

In this specification, one of the anode and the cathode whose potential can be controlled by a driving transistor is referred to as a first electrode while the other is referred to as a second electrode.

The light emitting device includes a panel in the condition that light emitting elements are sealed, and a module in the condition that an IC or the like including a controller is mounted on the panel. Further, the invention relates to an element substrate which corresponds to a mode where light emitting elements have not been completed in the manufacturing steps of the light emitting element. The element substrate comprises a means for supplying current to a light emitting element in each of a plurality of pixels.

The element substrate corresponds to a mode where light emitting elements have not been completed in the manufacturing steps of the light emitting device of the invention. Specifically, it may be the condition that only a first electrode of a light emitting element is completed, the condition that a conductive film to be a first electrode is deposited but not yet patterned to be completed, or various other conditions.

Note that transistor used in the light emitting device of the invention may be a thin film, transistor formed of a polycrystalline semiconductor, a microcrystalline semiconductor (including a semi-amorphous semiconductor), or an amorphous semiconductor, however, the invention is not limited to these. It may be a transistor formed by using single crystalline silicon or SOI. Alternatively, it may be a transistor formed by using an organic semiconductor or carbon nanotube. In addition, a transistor disposed in each pixel of the light emitting device of the invention may have a single-gate structure, a double-gate structure, or a multi-gate structure having more than two gates.

Semi-amorphous semiconductor has an intermediate structure between amorphous and crystalline (including single crystalline and polycrystalline) structures and has the third state which is stable in free energy. The semi-amorphous semiconductor includes a crystalline region having a short-range order and lattice distortion, and it can be obtained by dispersing crystalline grains of 0.5 to 20 nm into an amorphous semiconductor. Also, it has the characteristic that Raman spectrum is shifted to the lower frequency than 520 $cm^{-1}$, and has the observed diffraction peaks at (111) and (220) by the X-ray diffraction which is supposedly caused by the Si-crystal lattices. In addition, it contains hydrogen or halogen with a concentration of 1 or more atomic % in order to terminate dangling bonds. Such a semiconductor is called a semi-amorphous semiconductor (SAS) here for convenience. Further, a stable and superior semi-amorphous semiconductor can be obtained when the lattice distortion is further promoted by adding noble gas elements such as helium, argon, krypton and neon.

According to the invention, current flowing to a light emitting element does not easily fluctuate even without increasing a capacity of a capacitor provided between the gate and the source of a current controlling transistor or suppressing off-current of a transistor for controlling an input of a video signal to a pixel. The current flowing to the light emitting element is not even affected by the parasitic capacitance of the gate of the current controlling transistor. The current controlling transistor only selects whether to supply a current or not to the light emitting element, and the current value flowing to the light emitting element is determined by a driving transistor. Therefore, factors of variations can be decreased, leading to significantly enhanced image quality. In addition, since process optimization is not required for suppressing the off-current of the transistor for controlling an input of a video signal to the pixel, manufacturing process of transistors can be simplified, which significantly contributes to a cost reduction and improvement in yield.

In addition, according to the invention, the gate potential of the driving transistor can be fixed even when it is operated in the saturation region, therefore, the gate voltage Vgs thereof does not fluctuate easily. When the driving transistor is operated in the saturation region, the drain current thereof does not fluctuate by the drain voltage Vds, but determined only by the Vgs, therefore, the drain current can be kept constant in value even when the Vds is decreased instead of the Vel being increased in accordance with the degradation of the light emitting element. Accordingly, luminance decay of the light emitting element or luminance unevenness due to degradation of the electroluminescent materials can be suppressed.

In addition, according to the invention, a potential supplied to the gate of the driving transistor is compensated in accordance with the threshold voltage, therefore, luminance variations due to variations in the threshold voltage can be suppressed. In particular, when operating the driving transistor in the saturation region, the ratio of |Vgs| to |Vth| is small, thus the current flowing to the light emitting element easily fluctuates due to the variations in the threshold voltage Vth. However, according to the invention, such luminance variations can be suppressed even when using the saturation region since the potential supplied to the gate of the driving transistor can be compensated in accordance with the threshold voltage.

Further, according to the invention, a compensation transistor is only required to be formed correspondingly to the wiring for supplying a potential to the gate of each driving transistor, therefore, the compensation transistor is not required to be formed per pixel. Accordingly, the number of the transistors in a pixel can be suppressed, leading to high resolution.

BRIEF DESCRIPTION OF THE DRAWINGS

FIGS. 14A and 14B are top plan view and a cross-sectional view illustrating the light emitting device of the invention respectively.

DETAILED DESCRIPTION OF THE PREFERRED EMBODIMENTS

Embodiment Mode1

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein.

Figure 1A:
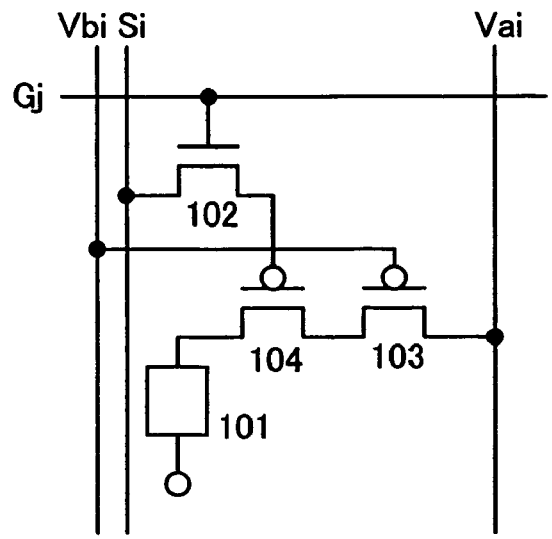
FIGS. 1A to 1D each illustrates a configuration of a pixel included in the light emitting device of the invention.

FIG. 1A illustrates a mode of a pixel included in a light emitting device of the invention. The pixel shown in FIG. 1A comprises a light emitting element 101, a transistor (switching transistor) 102 used as a switching element for controlling an input of a video signal to the pixel, a driving transistor 103 for controlling a current value supplied to the light emitting element 101 and a current controlling transistor 104 for determining whether to supply a current or not to the light emitting element 101. Further, a capacitor for holding a potential of a video signal may be disposed in the pixel though not shown in FIG. 1A.

The driving transistor 103 and the current controlling transistor 104 may either have the same conductivity or different conductivity. The driving transistor 103 is operated in the saturation region while the current controlling transistor 104 is operated in the linear region. Although the driving transistor 103 is desirably operated in the saturation region, the invention is not limited to this, and the driving transistor 103 may be operated in the linear region as well. The switching transistor 102 is operated in the linear region. The driving transistor 103 may be either an enhancement mode transistor or a depletion mode transistor. The switching transistor 102 may either be an N-channel transistor or a P-channel transistor.

The light emitting element 101 comprises an anode, a cathode and an electroluminescent layer interposed between them. One of the anode and the cathode is used as a first electrode while the other is used as a second electrode.

When the driving transistor 103 is a P-channel transistor as shown in FIG. 1A, the anode and the cathode of the light emitting element 101 are preferably used as the first electrode and the second electrode respectively. On the other hand, when the driving transistor 103 is an N-channel transistor, the cathode and the anode of the light emitting element 101 are preferably used as the first electrode and the second electrode respectively.

The gate of the switching transistor 102 is connected to a scan line Gj (j=1 to y). One of the source and the drain of the switching transistor 102 is connected to a signal line Si (i=1 to x) while the other is connected to the gate of the current controlling transistor 104. The gate of the driving transistor 103 is connected to a second power supply line Vbi (i=1 to x). The driving transistor 103 and the current controlling transistor 104 are connected to a first power supply line Vai (i=1 to x) and the light emitting element 101 so that a current supplied from the first power supply line Vai (i=1 to x) can be supplied to the light emitting element 101 as the drain current of the driving transistor 103 and the current controlling transistor 104. In this embodiment mode, the source of the driving transistor 103 is connected to the first power supply line Vai (i=1 to x), and the current controlling transistor 104 is disposed between the driving transistor 103 and the first electrode of the light emitting element 101.

When disposing a capacitor, one of the two electrodes of the capacitor is connected to the first power supply line Vai (i=1 to x) while the other is connected to the gate of the current controlling transistor 104. The capacitor is provided so as to hold the gate potential of the current controlling transistor 104.

Figure 1B:
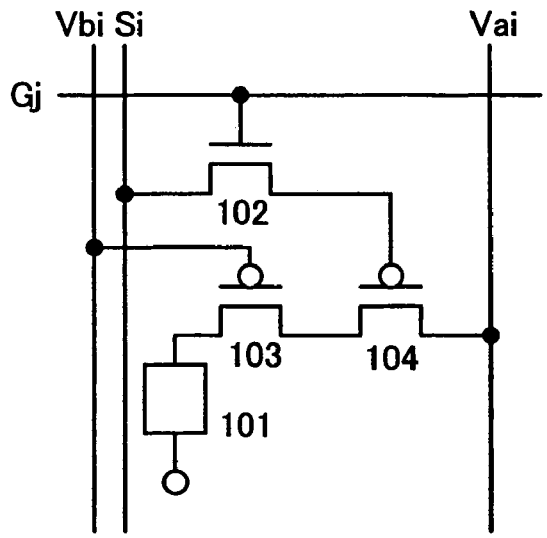

The pixel configuration shown in FIG. 1A illustrates only one mode of the invention, and the light emitting device of the invention is not exclusively limited to this. For example, as shown in FIG. 1B, another pixel configuration may be employed in which the drain of the driving transistor 103 is connected to the first electrode of the light emitting element 101, and the current controlling transistor 104 is disposed between the driving transistor 103 and the first power supply line Vai (i=1 to x). Note that common components between FIG. 1A and FIG. 1B are denoted by common reference numerals.

Figure 1C:
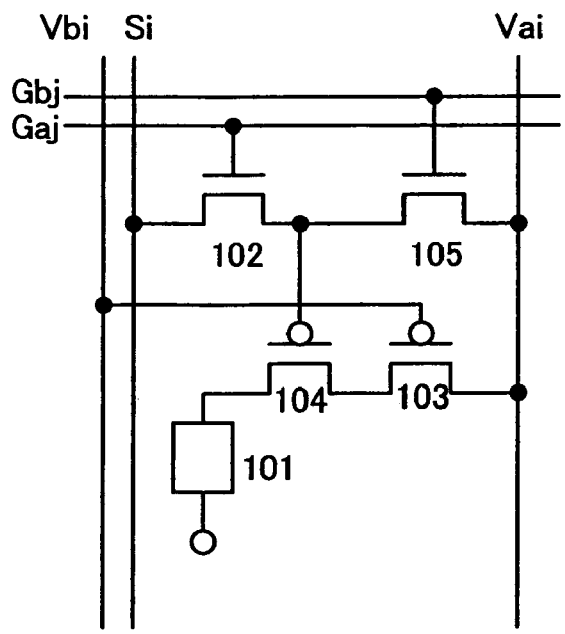

In addition, a transistor for erasing a potential of a written video signal (erasing transistor) may be disposed in each pixel. FIG. 1C illustrates an example where an erasing transistor is disposed in the pixel shown in FIG. 1A. Note that common components between FIG. 1A and FIG. 1C are given the identical reference numerals. In the pixel shown in FIG. 1C, in addition to the scan line connected to the gate of the switching transistor 102, another scan line is disposed so as to be connected to the gate of the erasing transistor 105. In order to make a distinction between these scan lines, the former is referred to as a first scan line Gaj (j=1 to y) and the latter is referred to as a second scan line Gbj (j=1 to y) in FIG. 1C. One of the source and the drain of the erasing TFT 105 is connected to the first power supply line Vai (i=1 to x) while the other is connected to the gate of the current controlling transistor 104.

Figure 1D:
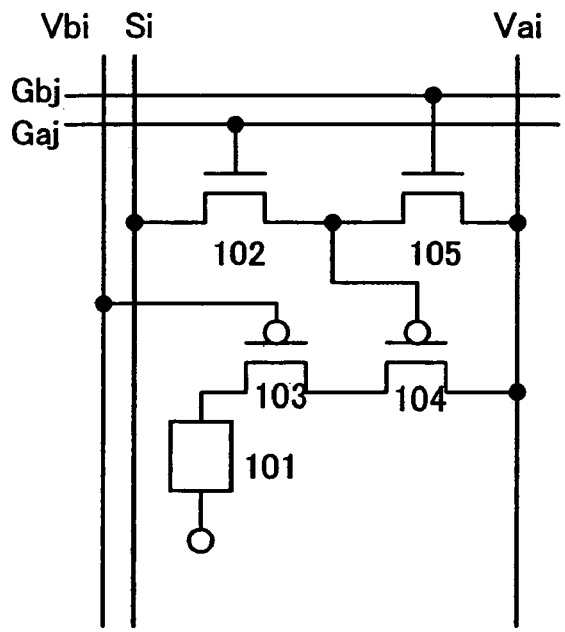

Note that as shown in FIG. 1D, still another pixel configuration may be employed in which the drain of the driving transistor 103 is connected to the first electrode of the light emitting element 101 while the current controlling transistor 104 is disposed between the driving transistor 103 and the first power supply line Vai (i=1 to x) in FIG. 1C. Note that common components between FIG. 1C and FIG. 1D are denoted by common identical reference numerals.

Figure 2:
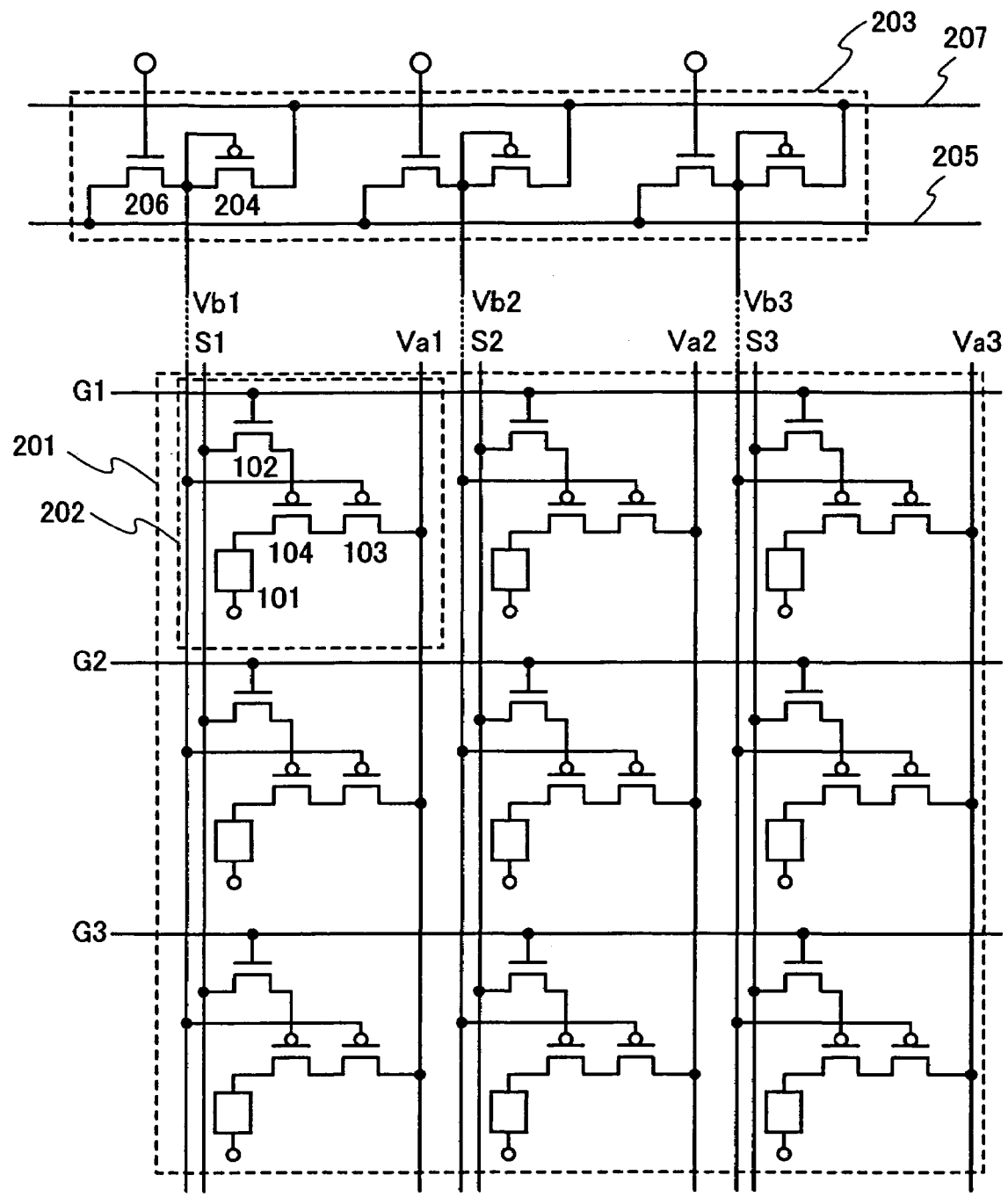
FIG. 2 illustrates a configuration of a pixel portion and a compensation circuit included in the light emitting device of the invention.

Now, description is made on a circuit for compensating a potential of the second power supply line Vbi (i=1 to x) connected to the gate of the driving transistor 103 (hereinafter referred to as a compensation circuit). FIG. 2 illustrates an exemplary configuration of a pixel portion and a compensation circuit of a light emitting device of the invention. Note that common components between FIG. 1A and FIG. 2 are denoted by common reference numerals.

As shown in FIG. 2, a pixel portion 201 comprises a plurality of pixels 202. Note that FIG. 2 illustrates the pixel 202 having a configuration shown in FIG. 1A, however, the invention is not limited to such configuration.

Second power supply lines Vb1 to Vb3 are each connected to a compensation circuit 203. FIG. 2 illustrates the configuration in which first power supply lines Va1 to Va3, the second power supply lines Vb1 to Vb3 and scan lines G1 to G3 are disposed in the pixel portion 201, however, the number of the wirings is not limited to these. As shown in the pixels shown in FIGS. 1C and 1D, the first scan line and the second scan line may be disposed in the pixel portion 201.

The compensation circuit 203 comprises a compensation transistor 204 whose gate and the drain are connected to each other, and a transistor 206 for controlling the connection between the third power supply line 205 and the drain and the gate of the compensation transistor 204. The source of the compensation transistor 204 is connected to a fourth power supply line 207. The drain and the gate of each compensation transistor 204 are connected to the second power supply lines Vb1 to Vb3 respectively.

The compensation transistor 204 has the same conductivity as the driving transistor 103 included in the pixel 202. The compensation transistor 204 and the driving transistor 103 desirably have the same characteristics such as the threshold voltage. Specifically, it is desirable that L/W ratios of the two transistors be substantially equal to each other.

When the driving transistor 103 and the compensation transistor 204 are both P-channel transistors, the fourth power supply line 207 is set at a lower potential than the first power supply lines Va1 to Va3. In addition, the third power supply line 205 is set at a lower potential than the potential that is obtained by subtracting the threshold voltage Vth of the compensation transistor 204 from the potential of the fourth power supply line 207. Each of the first power supply lines Va1 to Va3 is set at a higher potential than the second electrode of the light emitting element 101. Specifically, the potential difference between each of the first power supply lines Va1 to Va3 and the second electrode of the light emitting element 101 is set so as to allow a forward-bias current to be supplied to the light emitting element 101 when both of the driving transistor 103 and the current controlling transistor 104 are ON.

On the other hand, when the driving transistor 103 and the compensation transistor 204 are both N-channel transistors, the fourth power supply line 207 is set at a higher potential than the first power supply lines Va1 to Va3. In addition, the third power supply line 205 is set at a higher potential than the potential that is obtained by adding the threshold voltage Vth of the compensation transistor 204 to the fourth power supply line 207. Each of the first power supply lines Va1 to Va3 is set at a higher potential than the second electrode of the light emitting element 101. Specifically, the potential difference between each of the first power supply lines Va1 to Va3 and the second electrode of the light emitting element 101 is set so as to allow a forward-bias current to be supplied to the light emitting element 101 when both of the driving transistor 103 and the current controlling transistor 104 are ON.

Note that the transistor 206 may be either an N-channel transistor or a P-channel transistor.

Figure 3A:
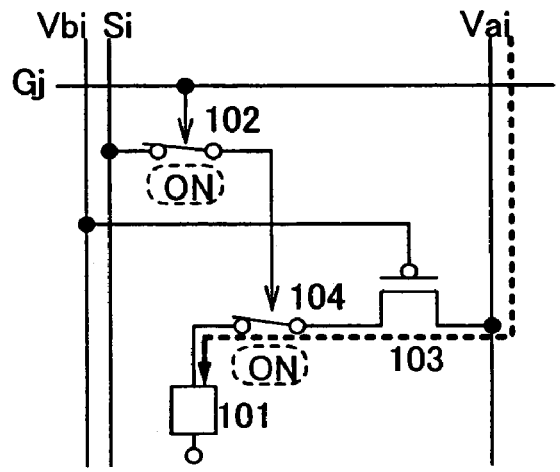
FIGS. 3A to 3D each illustrates the operation of a pixel included in the light emitting device of the invention.
Figure 3B:
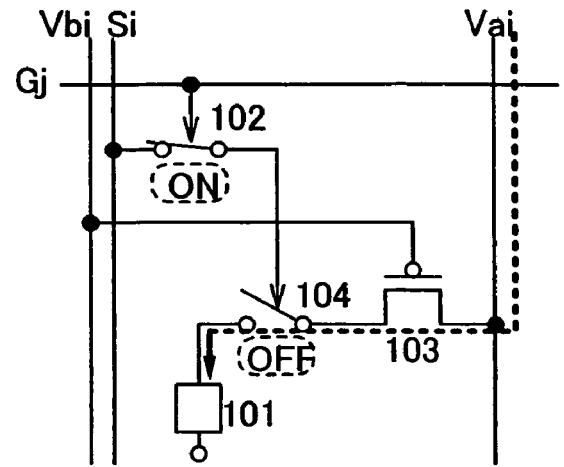
Figure 3C:
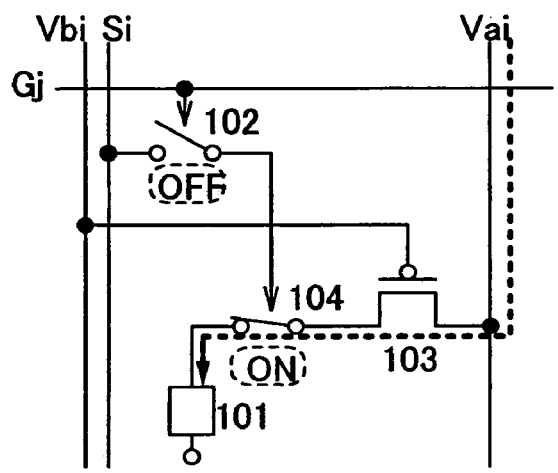
Figure 3D:
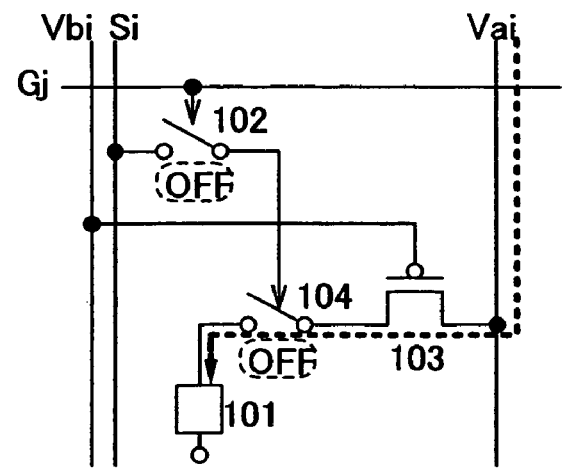

Now, description is made on the driving method of the light emitting device of the invention shown in FIG. 2, with reference to the pixel shown in FIG. 1A as an example. The operation of the pixel shown in FIG. 1A can be divided into a writing period and a holding period. FIG. 3A illustrates the operation in the writing period in which the current controlling transistor 104 is ON while FIG. 3B illustrates the operation in the writing period in which the current controlling transistor 104 is OFF. FIG. 3C illustrates the operation in the holding period in which the current controlling transistor 104 is ON while FIG. 3D illustrates the operation in the holding period in which the current controlling transistor 104 is OFF. Note that FIGS. 3A to 3D each illustrates the switching transistor 102 and the current controlling transistor 104 merely as switches for ease of description.

First, in the writing period, the scan line Gj (j=1 to y) is sequentially selected. When the scan line Gj is selected, the switching transistor 102 whose gate is connected to the scan line Gj is turned ON. Then, a video signal which is inputted to the signal line Si (i=1 to x) is inputted to the gate of the current controlling transistor 104 through the switching transistor 102 being ON.

When the current controlling transistor 104 is turned ON as shown in FIG. 3A by a potential of the video signal, a current is supplied to the light emitting element 101 through the first current supply line Vai (i=1 to x). The current flowing to the light emitting element 101 is determined by a drain current of the driving transistor 103 and the VI characteristics of the light emitting element 101. The light emitting element 101 emits light at a luminance corresponding to the supplied current. Meanwhile, when the current controlling transistor 104 is turned OFF in accordance with a potential of the video signal as shown in FIG. 3B, current supply to the light emitting element 101 stops, thereby the light emitting element 101 does not emit light.

In the holding period, the selection of the scan line Gj (j=1 to y) terminates, and the switching transistor 102 is turned OFF. The potential of the video signal inputted to the pixel in the writing period is held by a capacitor and the like in the holding period. Therefore, when the current controlling transistor 104 is ON in the writing period as shown in FIG. 3A, the current controlling transistor 104 is still ON in the holding period as shown in FIG. 3C. Thus, the light emitting element continues to emit light. On the other hand, when the current controlling transistor 104 is OFF in the writing period as shown in FIG. 3B, the current controlling transistor 104 is still OFF in the holding period as shown in FIG. 3D. Thus, the light emitting element 101 continues to emit no light.

According to the aforementioned operation, an image can be displayed. Note that gray scales can be displayed by repeating the aforementioned operation in one frame period. The number of gray scales can be determined by controlling the total period of the writing period and the holding period in which light emitting elements emit light in one frame period.

Note that in the aforementioned operation, the emission of the light emitting element 101 is controlled according to a video signal in the writing period, however, the invention is not limited to this configuration. For example, such configuration is possible that current supply to the whole light emitting elements 101 is stopped in the writing period so that the whole light emitting elements 101 do not emit light. Specifically in such a case, it is required that the potential difference between the second electrode of the light emitting element 101 and the first power supply line Vai (i=1 to x) be substantially zero only in the writing period. Alternatively, when assuming the light emitting element as a diode, the potential difference between the second electrode and the first power supply line Vai (i=1 to x) is required to be set so that a reverse-bias voltage can be applied between the opposite electrodes of the light emitting element 101. Further, a current path to the light emitting element may be blocked by a switch and the like.

In the case of a pixel having an erasing transistor as shown in FIGS. 1C and 1D, when the second scan line Gbj (j=1 to y) is selected to turn ON the erasing transistor TFT 105, the potential of each of the first power supply lines Va1 to Vax can be supplied to the gate of the current controlling TFW 104. Accordingly, the current controlling TFT 104 is turned OFF, and the light emitting element 101 can be forcibly brought into the state in which no current is supplied thereto.

Figure 4A:
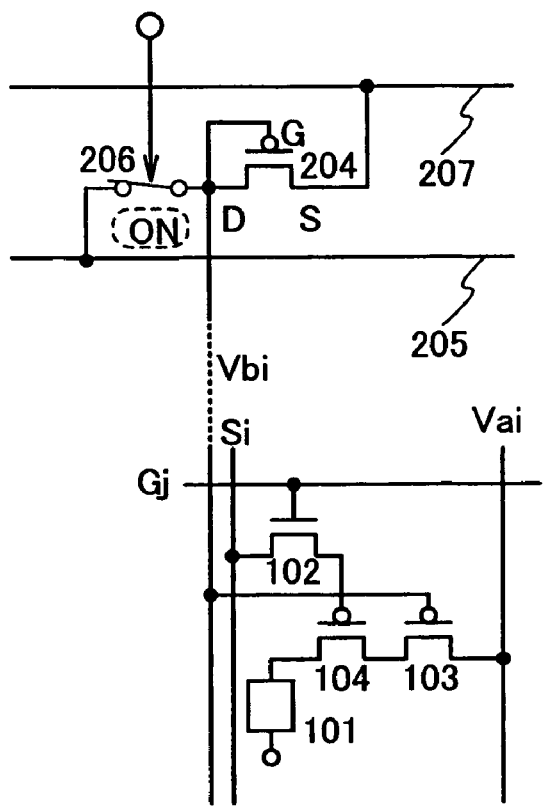
FIGS. 4A and 4B each illustrates the operation of a compensation circuit included in the light emitting device of the invention.
Figure 4B:
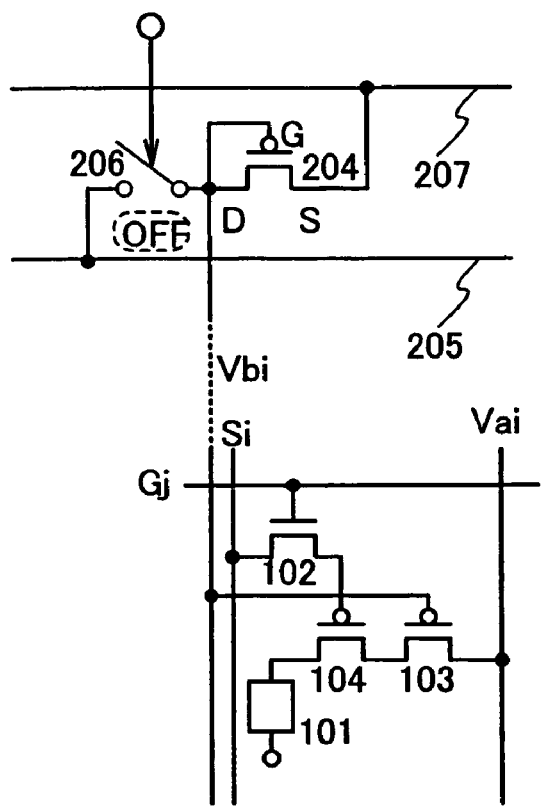

Now, operation of the compensation circuit 203 shown in FIG. 2 is described with reference to FIGS. 4A and 4B. FIG. 4A illustrates the operation of the compensation circuit 203 in compensating the potential of the second power supply line Vbi. Meanwhile, FIG. 4B illustrates the operation of the compensation circuit 203 in the period in which the compensated potential is maintained. Note that FIGS. 4A and 4B each illustrates the transistor 206 merely as a switch for ease of description.

First, as shown in FIG. 4A, the transistor 206 is turned ON to supply the potential of the third power supply line 205 to the gate and the drain of the compensation transistor 204. The source of the compensation transistor 204 is supplied with the potential of the fourth power supply line 207. As set forth above, when the compensation transistor 204 is a P-channel transistor, the third power supply line 205 is set to be at a lower potential than the potential that is obtained by subtracting the threshold voltage Vth of the compensation transistor 204 from the fourth power supply line 207. Accordingly, the compensation transistor 204 is turned ON, and a current corresponding to the potential difference between the third power supply line 205 and the fourth power supply line 207 flows between the source and the drain of the compensation transistor 204.

Next, the transistor 206 is turned OFF as shown in FIG. 4B. Then, a current flow path between the source and the drain of the compensation transistor 204 is blocked. Accordingly, current keeps on flowing between the source and the drain of the compensation transistor 204 to a certain extent until the gate voltage Vgs of the compensation transistor 204 becomes equal to the threshold voltage Vth. Thus, when the gate voltage Vgs becomes equal to the threshold voltage Vth finally, the compensation transistor 204 is turned OFF. Accordingly, when the compensation transistor 204 is turned OFF, the second power supply line Vbi connected to the gate and the drain of the compensation transistor 204 is supplied with the potential that is obtained by subtracting the threshold voltage Vth from the potential of the fourth power supply line 207.

Note that as set forth above, when the compensation transistor 204 is a P-channel transistor, the fourth power supply line 207 is set at a lower potential than the first power supply line Vai. Accordingly, when the current controlling transistor 104 is ON and assuming that the driving transistor 103 and the compensation transistor 204 have the same threshold voltage values, the gate voltage of the driving transistor 103 is lower than the threshold voltage thereof, therefore, it is turned ON to supply a current to the light emitting element 101. According to such configuration, even when the threshold voltage of the driving transistor 103 varies, the gate voltage Vgs thereof can be compensated in accordance with the variations, therefore, variations of a current to be supplied to the light emitting element 101 can be suppressed.

Note that the compensation circuit 203 shown in FIG. 2 can operate in parallel with the operation of the pixel 202.

Note that FIG. 2 and FIGS. 4A and 4B each illustrates a configuration in which the drain and the date of the compensation transistor 204 are directly connected to each of the second power supply lines Vb1 to Vb3, however, the invention is not limited to this configuration. For example, a switch may be provided for controlling the connection between the second power supply lines Vb1 to Vb3 and the drain and the gate of the compensation transistor 204. In this case, as shown in FIG. 4A, the transistor 206 is turned ON, and the switch is turned ON when the potential of the third power supply line 205 is supplied to the gate and the drain of the compensation transistor 204. Then, as shown in FIG. 4B, by turning OFF the transistor 206, the switch may be turned OFF after the compensation transistor 204 is turned OFF at the timing at which the potential obtained by subtracting the threshold voltage Vth from the potential of the fourth power supply line 207 is supplied to the second power supply line Vbi connected to the gate and the drain of the compensation transistor 204. By providing such a switch, it can be prevented that the potential of the second power supply line Vbi fluctuates after compensation.

Figure 17A:
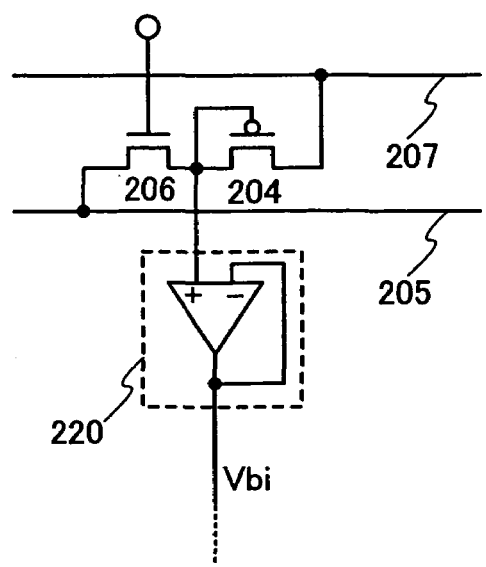
FIGS. 17A and 17B each illustrates a configuration of a compensation circuit included in the light emitting device of the invention.

In addition, the compensation circuit 203 may be equipped with an impedance transformer on its output side. FIG. 17A illustrates a configuration in which a voltage follower 220 is provided between the second power supply line Vbi and the drain and the gate of the compensation transistor 204. The voltage follower 220 is provided so that the non-inverting input terminal thereof is connected to the drain and the gate of the compensation transistor 204 while the output terminal thereof is connected to the second power supply line Vbi. According to such configuration, a potential drop due to the wiring resistance of the second power supply line Vbi can be suppressed.

Figure 5:
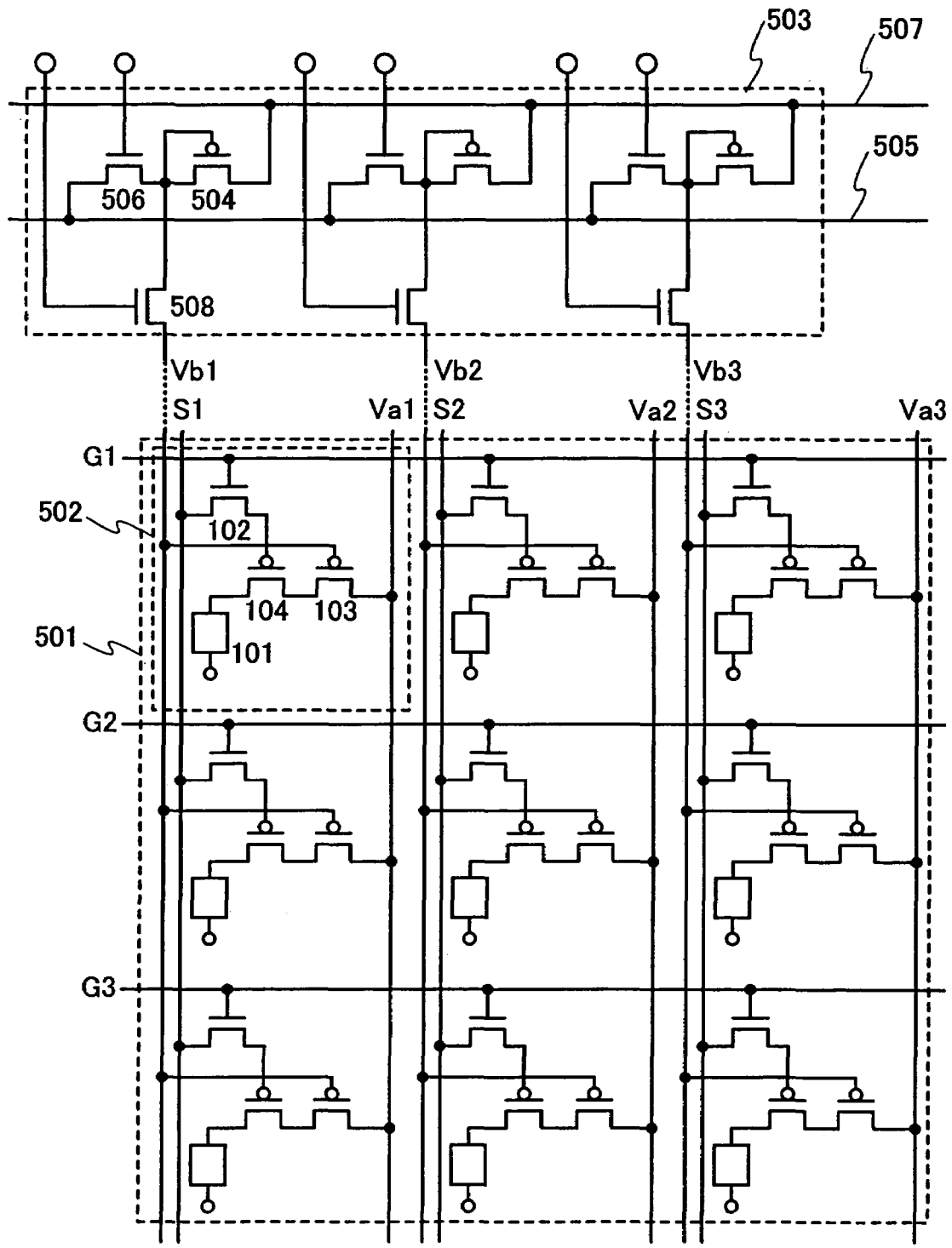
FIG. 5 illustrates a configuration of a pixel portion and a compensation circuit included in the light emitting device of the invention.

Now, description is made on a compensation circuit having a different configuration from FIG. 2. FIG. 5 illustrates an exemplary configuration of a pixel portion and a compensation circuit of a light emitting device of the invention. Note that common components between FIG. 1A and FIG. 5 are given the identical reference numerals.

As shown in FIG. 5, a pixel portion 501 comprises a plurality of pixels 502. Note that FIG. 5 illustrates the pixel 502 having a configuration shown in FIG. 1A, however, the invention is not limited to this.

The second power supply lines Vb1 to Vb3 are each connected to a compensation circuit 503. FIG. 5 illustrates the configuration in which the first power supply lines Va1 to Va3, the second power supply lines Vb1 to Vb3 and the scan lines G1 to G3 are disposed in the pixel portion 501, however, the number of the wirings is not limited to these. As shown in the pixels shown in FIGS. 1C and 1D, the first scan line and the second scan line may be disposed in the pixel portion 501.

The compensation circuit 503 comprises, correspondingly to each of the second power supply lines Vb1 to Vb3, a compensation transistor 504 whose gate and the drain are connected to each other, a transistor 506 for controlling the connection between a third power supply line 505 and the drain and the gate of the compensation transistor 504, and a transistor 508 for controlling the connection between the second power supply line Vb1 to Vb3 and the drain and the gate of the compensation transistor 504. The source of the compensation transistor 504 is connected to a fourth power supply line 507.

Note that the transistor 508 is only required to control the current flowing between the fourth power supply line 507 and the second power supply line Vbi, therefore, it is not required to be disposed between the second power supply lines Vb1 to Vb3 and the drain and the gate of the compensation transistor 504. For example, the transistor 508 may be disposed between the fourth power supply line 507 and the source of the compensation transistor 504. Alternatively, the transistor 508 may be disposed between the connecting node of the drain and the gate of the compensation transistor 504 and the drain of the compensation transistor 504.

The compensation transistor 504 has the same conductivity as the driving transistor 103 included in the pixel 202. The compensation transistor 504 and the driving transistor 103 desirably have the same characteristics such as the threshold voltage. Specifically, it is desirable that L/W ratios of the two transistors be substantially equal to each other.

It is most desirable that the potential of the fourth power supply line 507 is set nearly equal to that of the first power supply lines Va1 to Va3. This is because, when the fourth power supply line 507 is at the same potential as the first power supply lines Va1 to Va3, variations in the threshold voltage of the driving transistor 103 can be accurately reflected on the potential compensation of the second power supply line Vbi. However, the fourth power supply line 507 is not necessarily required to be at the same potential as the first power supply lines Va1 to Va3. The levels of the potentials may be determined by a designer optionally within the allowable range of accuracy for the compensation.

However, when the driving transistor 103 and the compensation transistor 504 are P-channel transistors, the fourth power supply line 507 is set at a potential equal to or higher than the first power supply lines Va1 to Va3. In addition, the first power supply lines Va1 to Va3 are set at a higher potential than the second electrode of the light emitting element 101. Specifically, the potential difference between the first power supply lines Va1 to Va3 and the second electrode of the light emitting element 101 is set so as to allow a forward-bias current to be supplied to the light emitting element 101 when both of the driving transistor 103 and the current controlling transistor 104 are ON.

On the other hand, when the driving transistor 103 and the compensation transistor 504 are both N-channel transistors, the fourth power supply line 507 is set at a potential equal to or higher than the first power supply lines Va1 to Va3. In addition, the first power supply lines Va1 to Va3 are set at a higher potential than the second electrode of the light emitting element 101. Specifically, the potential difference between the first power supply lines Va1 to Va3 and the second electrode of the light emitting element 101 is set so as to allow a forward-bias current to be supplied to the light emitting element 101 when both of the driving transistor 103 and the current controlling transistor 104 are ON.

Note that each of the transistor 506 and the transistor 508 may be either an N-channel transistor or a P-channel transistor.

Figure 6A:
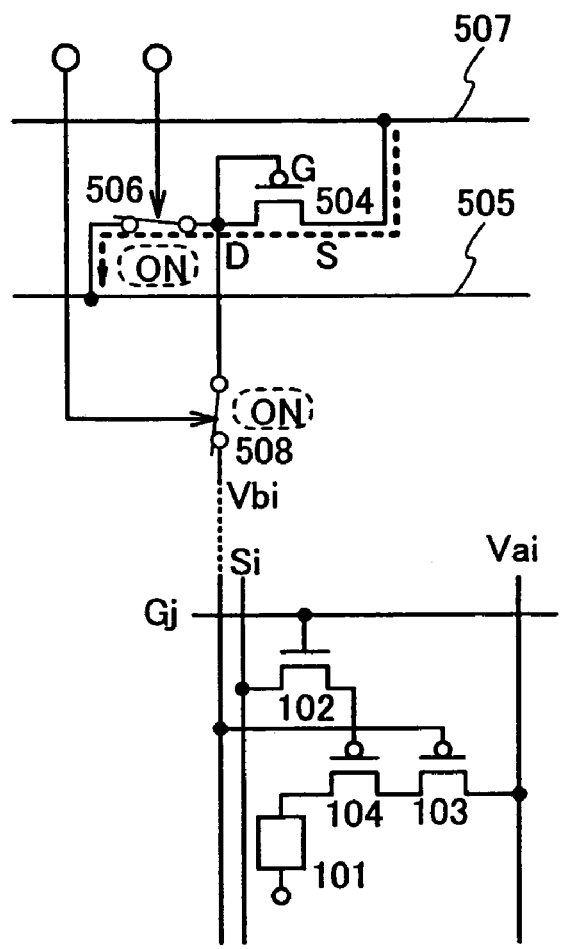
FIGS. 6A and 6B each illustrates the operation of a compensation circuit included in the light emitting device of the invention.
Figure 6B:
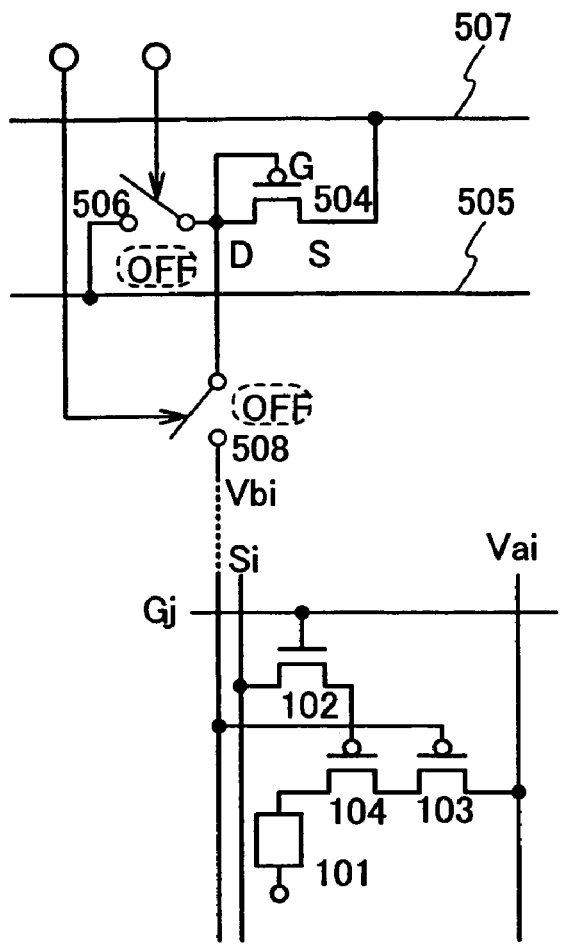

Now, operation of the compensation circuit 503 shown in FIG. 5 is described with reference to FIGS. 6A and 6B. FIG. 6A illustrates the operation of the compensation circuit 503 in compensating the potential of the second power supply line Vbi. Meanwhile, FIG. 6B illustrates the operation of the compensation circuit 503 in the period in which the compensated potential is maintained. Note that FIGS. 6A and 6B each illustrates the transistor 506 and the transistor 508 merely as switches for ease of description.

First, as shown in FIG. 6A, the transistor 506 and the transistor 508 are turned ON. Then, a constant current I flows between the third power supply line 505 and the fourth power supply line 507. The constant current I corresponds to a drain current of the compensation transistor 504. Note that the compensation transistor 504 operates in the saturation region, therefore, the drain current of the compensation transistor 504 satisfies the following Formula 1. Note that in Formula 1, $\beta = \mu C_0 W/L$, $\mu$=mobility, $C_0$=gate capacitance per unit area, and W/L=ratio of the channel width W to the channel length L of a channel formation region.

$$I = \beta(Vgs - Vth)^2/2 \quad \text{[Formula 1]}$$

It is ascertained from Formula 1 that the gate voltage Vgs of the compensation transistor 504 is determined by the current I flowing between the third power supply line 505 and the fourth power supply line 507. At this time, the transistor 508 is ON, therefore, when the fourth power supply line 507 is at the same potential as the first power supply line Vai, the compensation transistor 504 and the driving transistor 103 can have the same gate voltage Vgs. Accordingly, when the compensation transistor 504 and the driving transistor 103 have similar characteristics, specifically such as $\mu C_0 W/L$ and the threshold voltage Vth, the drain current of the driving transistor 103 and the drain current I of the compensation transistor 504 can have the same value when the current controlling transistor 104 is ON. Accordingly, luminance variations of the light emitting element 101 can be suppressed even when the characteristics of the driving transistor 103 in the pixel portion vary.

Then, the transistors 506 and 508 are turned OFF as shown in FIG. 6B. It is preferable that the transistor 508 be turned OFF prior to the transistor 506 since it can suppress the potential fluctuation of the second power supply line Vbi. By turning OFF the transistors 506 and 508, the gate voltage Vgs of the driving transistor 103 can be maintained.

Note that the compensation circuit 503 shown in FIG. 5 can operate in parallel with the operation of the pixel 502.

Figure 17B:
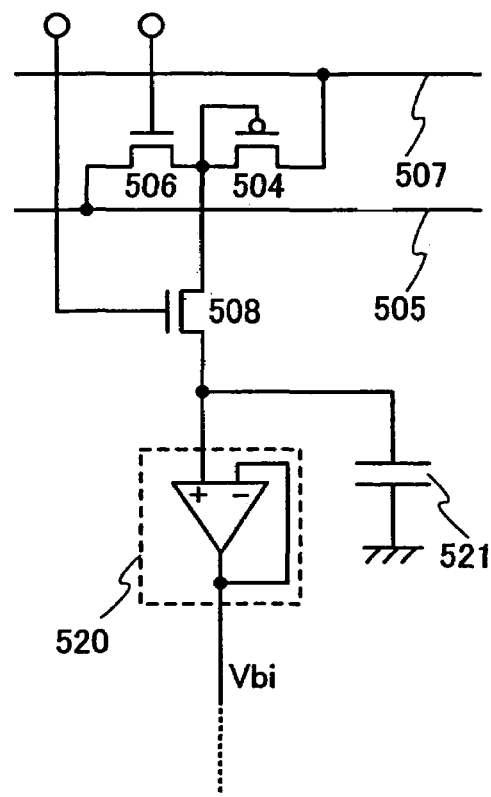

In addition, the compensation circuit 503 may be provided with an impedance transformer on its output side. FIG. 17B illustrates a configuration in which a voltage follower 520 and a capacitor 521 are provided between the second power supply line Vbi and the source or drain of the compensation transistor 508. The voltage follower 520 is provided so that the non-inverting input terminal thereof is connected to the source or the drain of the transistor 508 while the output terminal thereof is connected to the second power supply line Vbi. One of the two electrodes of the capacitor 521 is connected to the non-inverting input terminal of the voltage follower 520 while the other thereof is connected to the ground. According to such configuration, a potential drop due to the wiring resistance of the second power supply line Vbi can be suppressed.

According to the invention, in the case where the second power supply line Vbi is shared by a plurality of pixels, it is desirable that a driving transistor in each pixel have the same characteristics as the corresponding compensation transistor. TFTs can have similar characteristics by uniformly forming the channel length, channel width, materials or thickness of active layers, insulating films, gate electrodes and the like. In addition, when adopting a TFT which utilizes a semi-amorphous semiconductor or a polycrystalline semiconductor as its active layer, it is extremely important to obtain uniform crystallinity of the semiconductor film used as an active layer as well as the uniform outer shape and materials of the TFT as set forth above. For example, when crystallizing a semiconductor film by laser annealing, the region to be an active layer of a plurality of driving transistors which share the second power supply line Vbi and the region to be an active layer of compensation transistors provided correspondingly to the respective driving transistors are located within the same beam spot. Note that when irradiating laser light of a plurality of pulses to one spot, the aforementioned two regions are both located within the same beam spot of at least one pulse.

Note that the crystallization of the semiconductor film is not limited to laser crystallization, and crystallization using catalytic agents can be combined.

As for the laser, a known pulsed gas laser or a solid-state laser can be employed. For example, a YAG laser doped with Cr, Nd, Er, Ho, Ce, Co, Ti or Tm, a $YVO_4$ laser, a YLF laser, a $YAlO_3$ laser, a glass laser, a ruby laser, an alexandrite laser, a Ti: sapphire laser, a forsterite laser ($Mg_2SiO_4$) and the like can be employed. The fundamental wave of such laser differs according to the material to be doped, however, laser light having a fundamental wave of about 1 μm can be obtained. The second, third and fourth harmonics of the fundamental wave can be obtained by using a non-linear optical element.

Figure 7A:
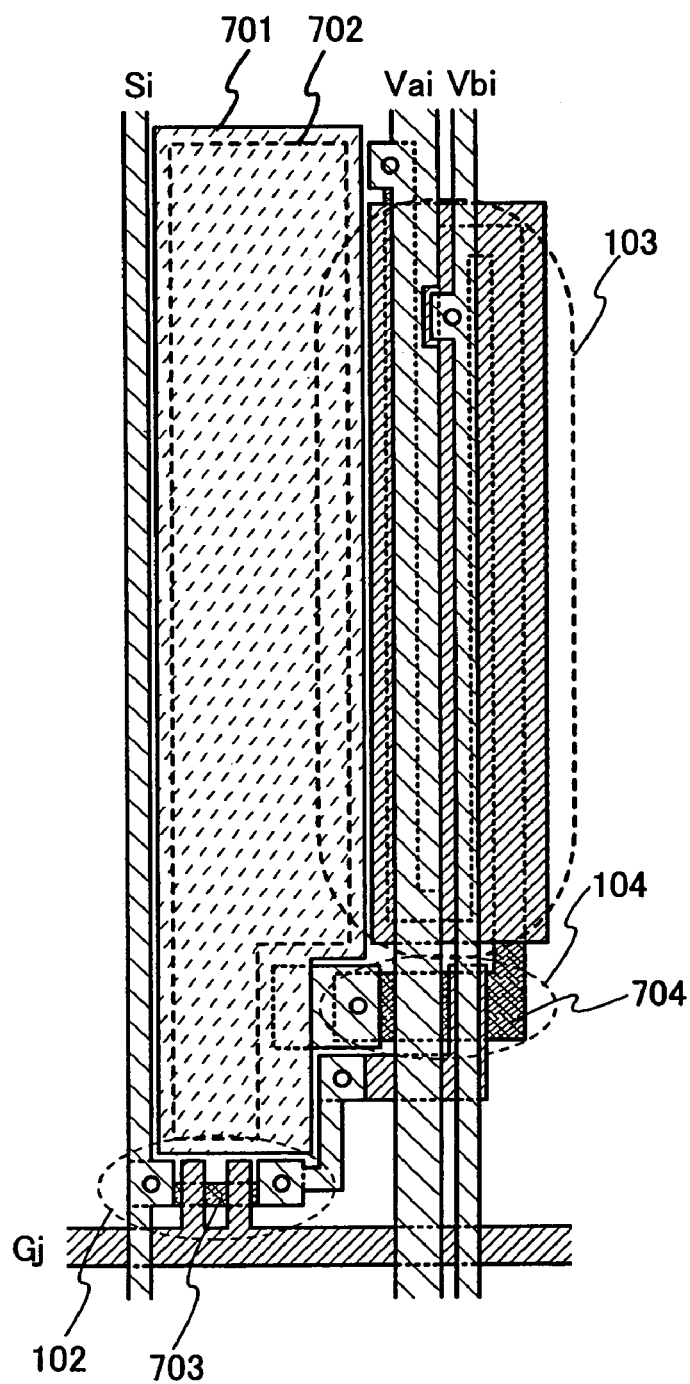
FIG. 7A illustrates a top plan view of a pixel and FIG. 7B illustrates a top plan view of a compensation circuit.
Figure 7B:
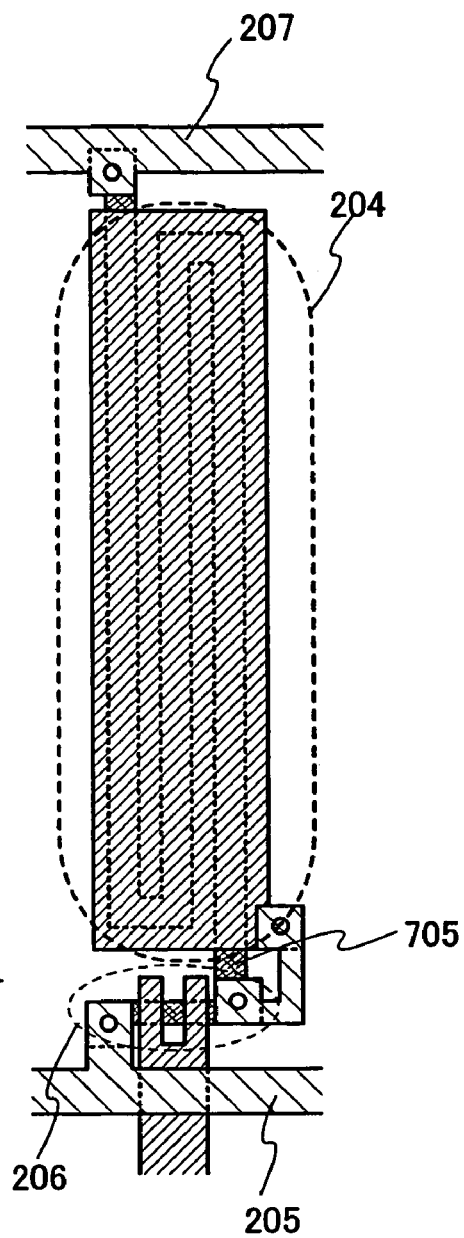
Figure 8:
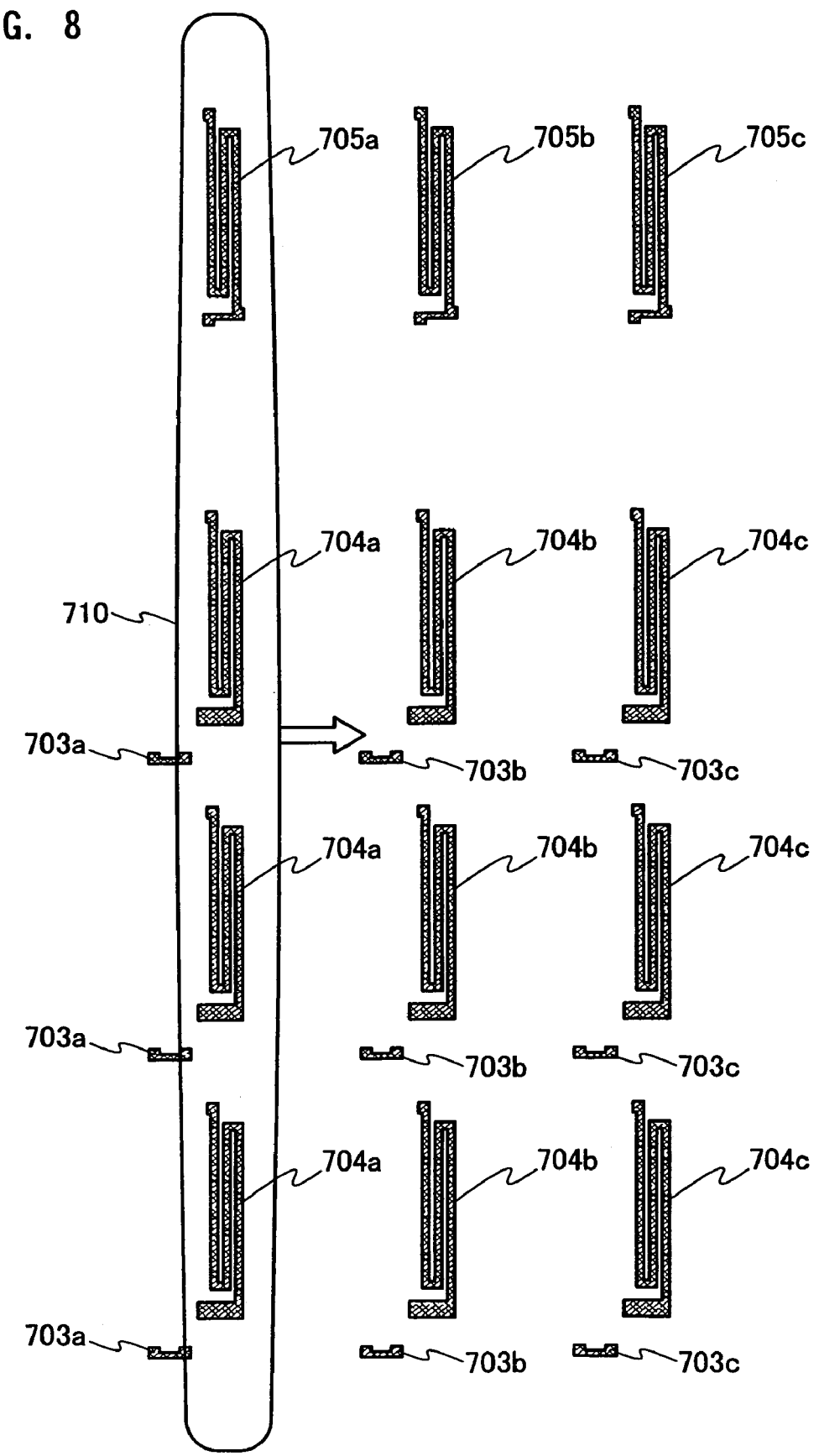
FIG. 8 illustrates a beam spot and a layout of areas where active layers are formed.

Now, description is made on the structure of the light emitting device of the invention which is formed by laser annealing with reference to FIGS. 7A, 7B and 8. Note that common components between FIG. 2 and FIGS. 7A and 7B are denoted by common reference numerals.

FIG. 7A illustrates an exemplary top plan view of the pixel 202 shown in FIG. 2. Note that FIG. 7A only illustrates a first electrode 701, and a region 702 where the first electrode 701 actually overlaps an electroluminescent layer and a second electrode of the light emitting element 101. In FIG. 7A, the switching transistor 102 has an active layer 703, and the driving transistor 103 and the current controlling transistor 104 share an active layer 704.

FIG. 7B illustrates an exemplary top plan view of the compensation circuit 203 shown in FIG. 2. In FIG. 7B, the compensation transistor 204 and the transistor 206 share an active layer 705.

FIG. 8 is a view illustrating the crystallization of a semiconductor film used as an active layer by laser annealing. In FIG. 8, laser light is scanned as shown in a hollow arrow. Each of the regions denoted by 703a to 703c corresponds to the region that is later used as the active layer 703 of the switching transistor 102 shown in FIG. 7A. Each of the regions denoted by 704a to 704c corresponds to the region that is later used as the active layer 704 of the driving transistor 103 and the current controlling transistor 104 shown in FIG. 7A. Each of the regions denoted by 705a to 705c corresponds to the region that is later used as the active layer 705 of the compensation transistor 204 and the transistor 206 shown in FIG. 7B.

In addition, the regions denoted by 704a corresponds to the plurality of pixels 202 which share the second power supply line Vb1 while the region denoted by 705a corresponds to the compensation transistor 204 for compensating the potential of the second power supply line Vb1. According to the invention, laser annealing is applied so that the regions denoted by 704a and 705a can be within a beam spot 710 of laser light. Note that in the case of irradiating laser light of a plurality of pulses to one spot, the regions denoted by 704a and 705a are located within the same beam spot 710 of at least one pulse.

Similarly, the regions denoted by 704b correspond to the plurality of pixels 202 which share the second power supply line Vb2 while the region denoted by the 705b corresponds to the compensation transistor 204 for compensating the potential of the second power source line Vb2. According to the invention, laser annealing is applied so that the regions denoted by 704b and 705b can be within the beam spot 710 of laser light. Note that in the case of irradiating laser light of a plurality of pulses to one spot, the regions denoted by 704b and 705b are located within the same beam spot 710 of at least one pulse.

Similarly, the regions denoted by 704c correspond to the plurality of pixels 202 which share the second power supply line Vb3 while the region denoted by the 705c corresponds to the compensation transistor 204 for compensating the potential of the second power supply line Vb3. According to the invention, laser annealing is applied so that the regions denoted by 704c and 705c can be within the beam spot 710 of laser light. Note that in the case of irradiating laser light of a plurality of pulses to one spot, the regions denoted by 704c and 705c are located within the same beam spot 710 of at least one pulse.

It is desirable that layout of the regions 704a, 704b and 704c to be the active layers of driving transistors and the regions 705a, 705b and 705c to be the active layers of the compensation transistors be designed such that the moving direction of carriers and its path are substantially the same when actually being utilized as the active layers.

Note that FIG. 8 illustrates the case where the signal line and the second power supply lines are disposed in parallel, and the axial direction of the beam spot 710 and the extending direction of the signal line are set in parallel correspondingly, however, the invention is not limited to this structure. When the scan line and the second power supply lines are disposed in parallel, the axial direction of the beam spot 710 and the extending direction of the scan line are set in parallel correspondingly.

According to such structure, variations in crystallinity can be decreased between the active layer of the driving transistor and the active layer of the compensation transistor provided correspondingly to the driving transistor, even when the output of laser light varies between pulses. Therefore, the driving transistor in each of a plurality of pixels that share the second power supply line Vbi can have similar characteristics to the compensation transistor provided correspondingly to the driving transistor.

Embodiment 1

Figure 9:
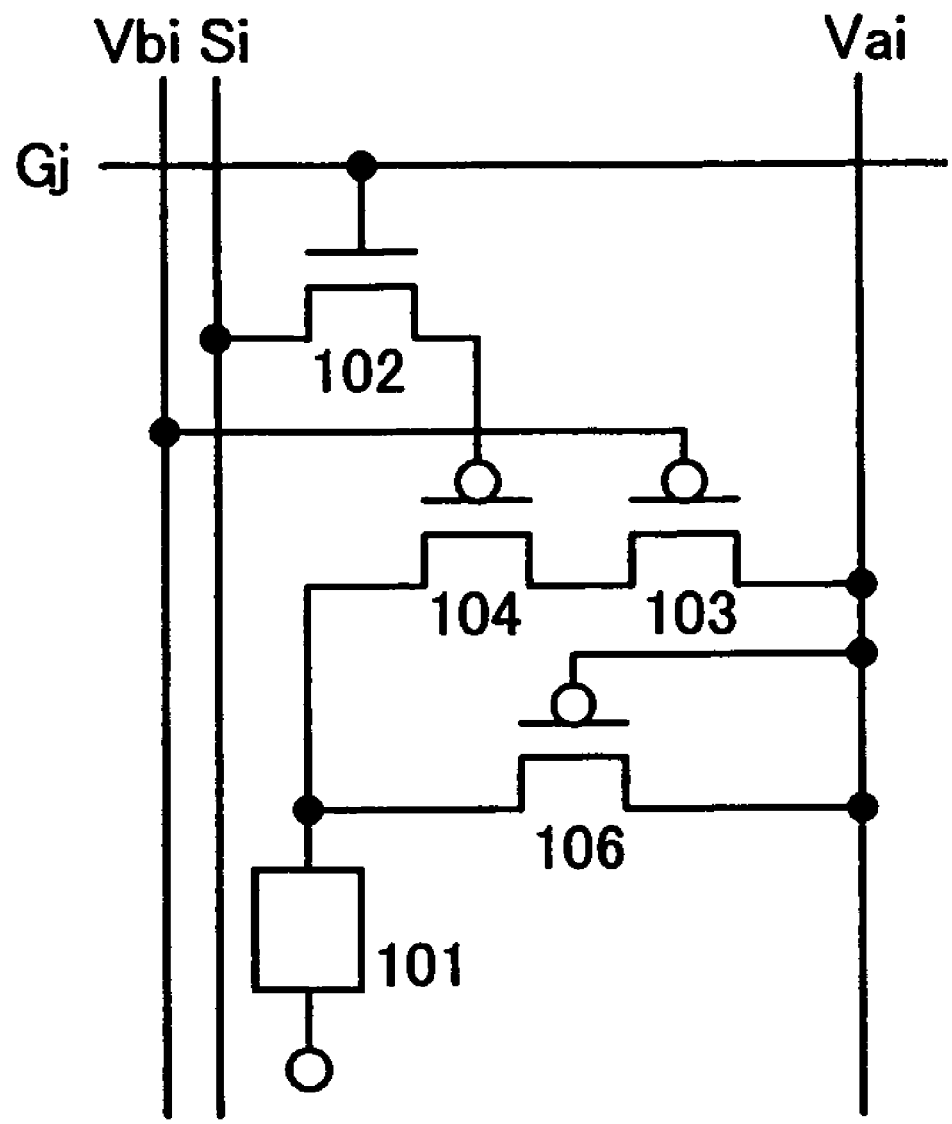
FIG. 9 illustrates a configuration of the light emitting device of the invention.

In this embodiment, description is made on the pixel configuration of FIG. 1 in which a TFT (alternating transistor) is provided for applying a reverse-bias voltage to the light emitting element 101. FIG. 9 illustrates the pixel configuration of the alternating transistor 106 disposed in the pixel of FIG. 1A. Note that common components between FIG. 1A and FIG. 9 are denoted by common reference numerals.

One of the source and the drain of the alternating transistor 106 is connected to the first electrode of the light emitting element 101 while the other thereof is connected to the first power supply line Vai. Note that although FIG. 9 illustrates the configuration in which one of the source and the drain of the alternating transistor 106 is connected to the first power supply line Vai, the invention is not limited to this. One of them may be connected to the second power supply line Vbi or to another wiring which is separately prepared.

The gate electrode of the alternating transistor 106 is connected to the first power supply line Vai. Note that although FIG. 9 illustrates the configuration in which the gate electrode of the alternating transistor 106 is connected to the first power supply line Vai, the invention is not limited to this. The gate electrode of the alternating transistor 106 may be connected to the second power supply line Vbi or to another wiring which is separately provided. However, the gate electrode of the alternating transistor 106 is required to be at a potential equal to or lower than the source potential thereof when applying a forward-bias potential. Note that the alternating transistor 106 may be either an N-channel transistor or a P-channel transistor.

By forming the alternating transistor 106, a reverse-bias voltage can be certainly applied to the light emitting element 101 regardless of the operation of the driving TFT 103 and the current controlling TFT 104. By applying a reverse-bias voltage to the light emitting element 101, the reliability of the light emitting element 101 can be enhanced. In addition, since dust and the like which cause short-circuit between the first electrode and the second electrode can be burned out, higher yield can be obtained.

Note that description is made in this embodiment mode on the example where an alternating transistor is formed in the pixel shown in FIG. 1A, however, the invention is not limited to this configuration. For example, the alternating transistor may be formed in the pixels shown in FIGS. 1B to 1D.

Embodiment 2

Figure 10:
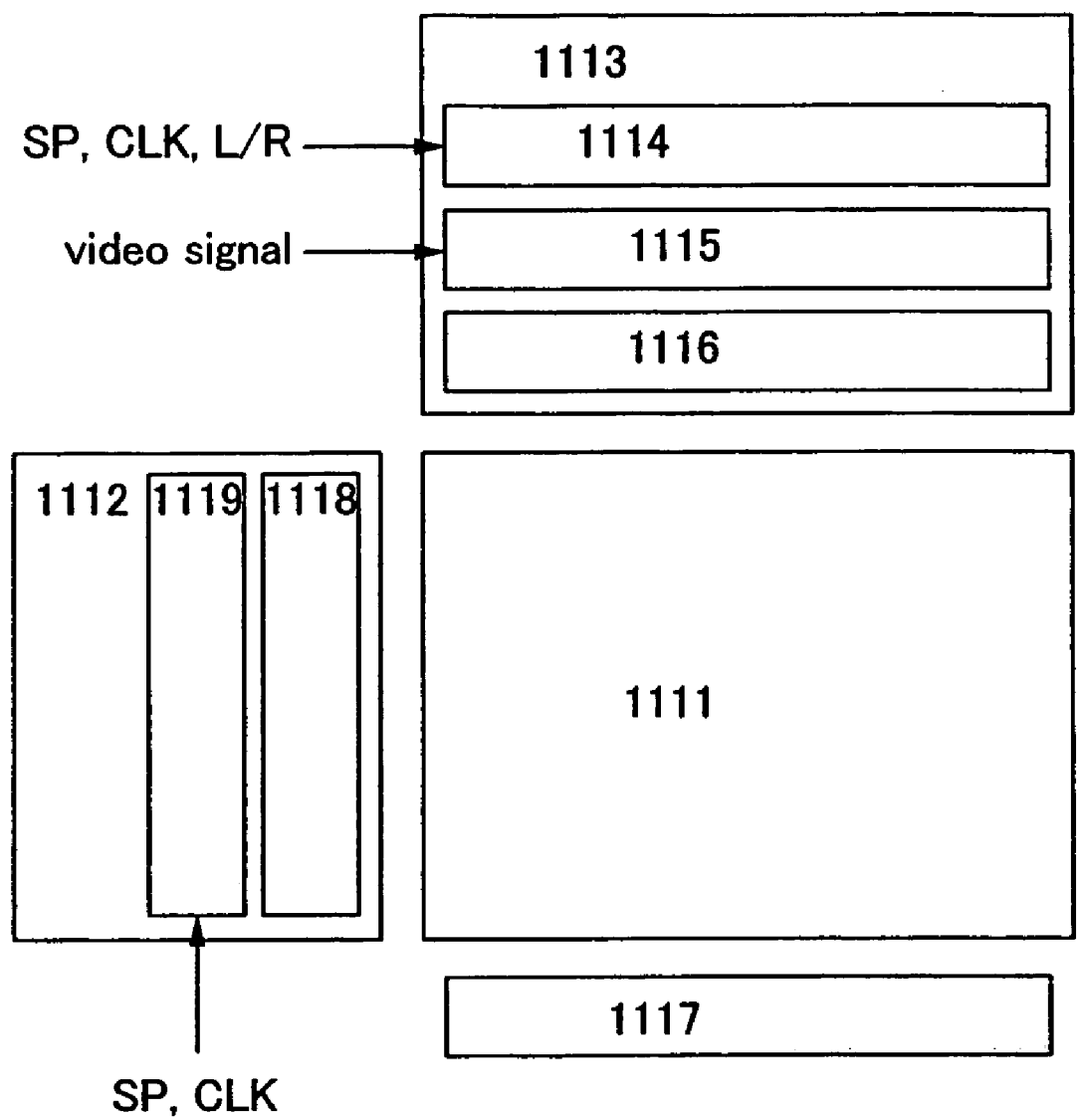
FIG. 10 is a block diagram illustrating a configuration of the light emitting device of the invention.

In this embodiment mode, description is made on a driver circuit used for a light emitting device of the invention. FIG. 10 illustrates a block diagram, of a light emitting device of this embodiment. The light emitting device shown in FIG. 10 comprises a pixel portion 1111 having a plurality of pixels each of which includes a light emitting element. The light emitting device also comprises a scan line driver circuit 1112 for selecting each pixel, a signal line driver circuit 1113 for controlling an input of a video signal to a selected pixel, and a compensation circuit 1117 for compensating a potential of the second power supply line Vbi.

In FIG. 10, the signal line driver circuit 1113 includes a shift register 1114, a latch A1115 and a latch B1116. The shift register 1114 is inputted with a clock signal (CLK), a start pulse signal (SP) and a switching signal (L/R). When the clock signal CLK and the start pulse signal (SP) are inputted, timing signals are generated in the shift register 1114. According to the switching signal (L/R), the order in which pulses of a timing signal appear is changed. The generated timing signals are sequentially inputted to the latch A1115 of the first stage. When the timing signals are inputted to the latch A1115, video signals are sequentially written to and stored in the latch A1115 in accordance with the pulses of the timing signals. Note that although video signals are written to the latch A1115 in this embodiment mode, the invention is not limited to this configuration. For example, another configuration may be employed in which the latch A1115 having a plurality of stages is divided into several groups so that video signals can be inputted per group in parallel, namely division drive may be performed. Note that the number of groups at this time is called the number of division. For example, when the latch is divided into four groups, the division drive is performed with the four divided groups.

The time required for video signals to be written to all the stages of the latch A1115 is referred to as a line period. The line period may actually include a horizontal retrace period in some cases.

When one line period is completed, latch signals are supplied to the latch B1116 of the second stage. In accordance with the latch signals, video signals held in the latch A1115 are written to the latch B1116 all at once, and thus held therein. The latch A1115 which has transferred the video signals to the latch B1116 is sequentially written with the subsequent video signals in synchronization with the timing signals from the shift register 1114. Video signals written to and held in the latch B1116 are inputted to the pixel portion 1111 during the second line period.

Now, description is made on the configuration of the scan line driver circuit 1112. The scan line driver circuit 1112 includes a shift register 1119 and a buffer 1118. In addition, it may include a level shifter as required. When a clock signal CLK and a start pulse SP are inputted to the shift register 1119 in the scan line driver circuit 1112, selection signals are generated. The generated selection signals are buffer amplified in the buffer 1118, and then supplied to corresponding scan lines. A scan line is connected to the gates of transistors for one line of pixels. Since transistors for one line of pixels are required to be turned ON all at once, the buffer 1118 is required to be capable of flowing large current.

Note that instead of the shift registers 1114 and 1119, another circuit capable of selecting signal lines such as a decoder circuit may be employed as well.

Although FIG. 10 illustrates an example where the compensation circuit 1117 is disposed on the opposite side of the signal line driver circuit 1113 across the pixel portion 1111, the invention is not limited to this configuration. The compensation circuit 1117 may be disposed between the signal line driver circuit 1113 and the pixel portion 1111. Alternatively, two compensation circuits 1117 may be disposed: one between the signal line driver circuit 1113 and the pixel portion 1111 and the other on the opposite side of the signal line driver circuit 1113 across the pixel portion 1111. By disposing the compensation circuit 1117 on both sides, time required for the potential compensation of the second power supply line can be shortened, and a potential drop of the second power supply line due to the wiring resistance can be suppressed.

Note that when the semiconductor elements in the pixel portion 1111 are formed of amorphous semiconductors, the scan line driver circuit 1112 and the signal line driver circuit 1113 may be formed over a different substrate than the substrate over which the pixel portion 1111 is formed, and the former substrate may be mounted on the latter substrate.

Alternatively, when the semiconductor elements in the pixel portion 1111 are formed of microcrystalline semiconductors, the scan line driver circuit 1112 may be formed over the same substrate over which the pixel portion 1111 is formed while the signal line driver circuit 1113 may be formed over a different substrate than the substrate over which the pixel portion 1111 is formed. Then, the signal line driver circuit 1113 may be mounted on the substrate over which the pixel portion 1111 and the scan line driver circuit 1112 are formed.

Embodiment 3

Figure 11A:
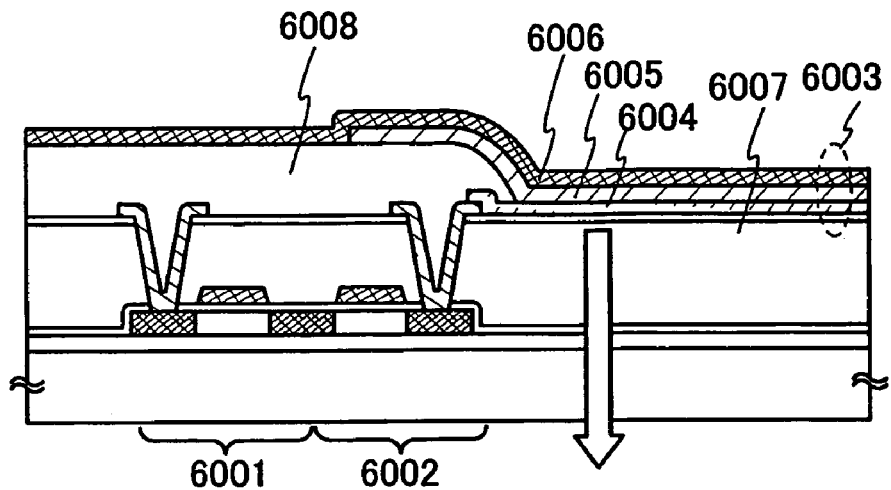
FIGS. 11A to 11C each illustrates a cross-sectional diagram of a pixel included in the light emitting device of the invention.
Figure 11B:
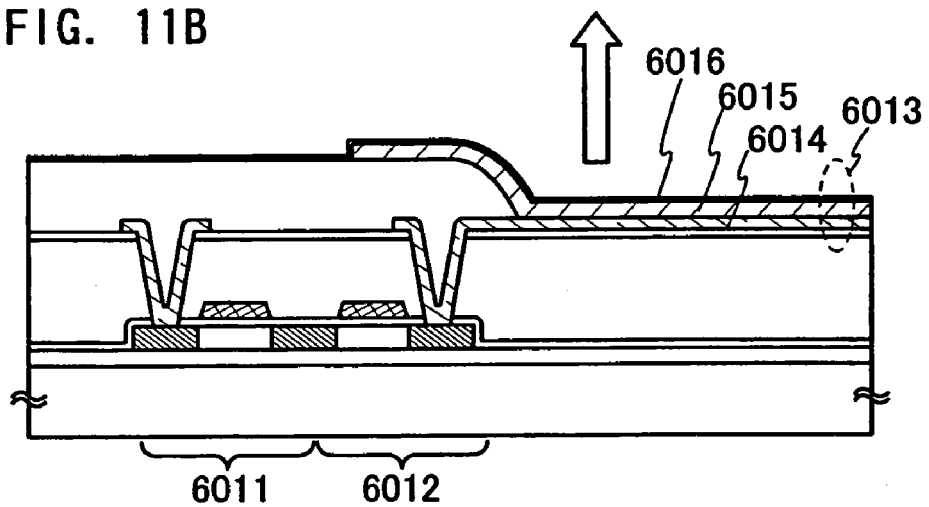
Figure 11C:
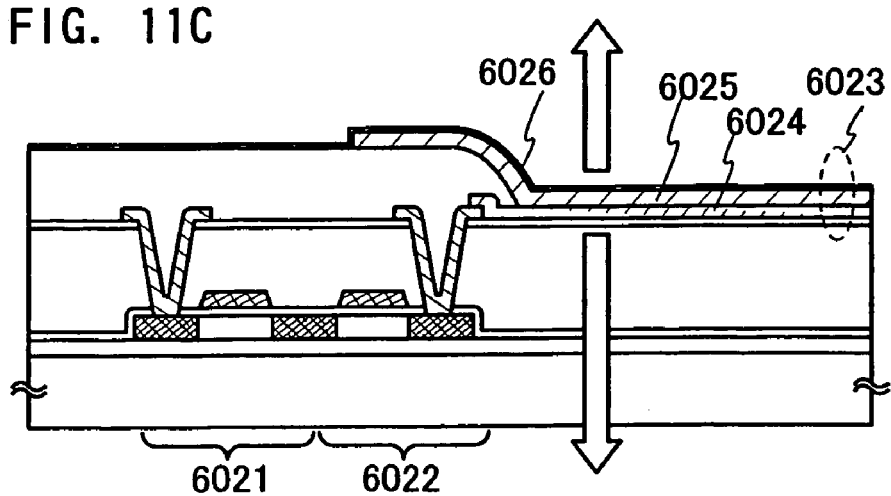

In this embodiment mode, description is made on the cross-sectional structure of a pixel in the case where a driving transistor is a P-channel transistor with reference to FIGS. 11A to 11C. Although FIGS. 11A to 11C each illustrates the case where the first electrode is an anode while the second electrode is a cathode, opposite structure may be employed such that the first electrode is a cathode while the second electrode is an anode.

FIG. 11A illustrates a cross-sectional diagram of a pixel in the case where a driving transistor 6001 and a current controlling transistor 6002 are both P-channel transistors and light emitted from a light emitting element 6003 is extracted from a first electrode 6004 side. Although FIG. 11A illustrates the structure in which the first electrode 6004 of the light emitting element 6003 is electrically connected to the current controlling transistor 6002, the first electrode 6004 of the light emitting element 6003 may be electrically connected to the driving transistor 6001.

The driving transistor 6001 and the current controlling transistor 6002 are covered with an interlayer insulating film 6007, and a bank 6008 having an opening is formed over the interlayer insulating film 6007. In the opening of the bank 6008, a part of the first electrode 6004 is exposed, and the first electrode 6004, an electroluminescent layer 6005 and a second electrode 6006 are stacked in this order.

The interlayer insulating film 6007 may be formed of an organic resin film, an inorganic resin film or an insulating film formed of a siloxane material as a starting material and having Si—O—Si bonds (hereinafter referred to as a siloxane insulating film). The siloxane insulating film may contain as a substituent at least one of hydrogen, fluorine, an alkyl group and aromatic hydrocarbon. Alternatively, the interlayer insulating film 6007 may be formed of a so-called low dielectric constant material (low-k material).

The bank 6008 may be formed of an organic resin film, an inorganic insulating film or a siloxane insulating film. In the case of the organic resin film, for example, acrylic, polyimide, polyamide and the like can be used while in the case of the inorganic insulating film, silicon oxide or silicon nitride oxide and the like may be employed. In particular, when the bank 6008 is formed of a photosensitive organic resin film, and has an opening on the first electrode 6004, it can be prevented that the first electrode 6004 and the second electrode 6006 are short-circuited by forming the side face of the opening to have a slope with a continuous curvature.

The first electrode 6004 is formed of a material or with a thickness to transmit light, which is also suitable for being used as an anode. For example, the first electrode 6004 can be formed of indium tin oxide (ITO), zinc oxide (ZnO), indium zinc oxide (IZO), gallium-doped zinc oxide (GZO), or other light transmitting conductive oxides. Alternatively, the first electrode 6004 may be formed of a mixture of ITO, indium tin oxide containing silicon oxide (hereinafter referred to as ITSO) or indium oxide containing silicon oxide with zinc oxide (ZnO) of 2 to 20%. Further, in addition to the aforementioned light transmitting conductive oxides, the first electrode 6004 may be formed of, for example, a single-layer-film of one or more of TiN, ZrN, Ti, W, Ni, Pt, Cr, Ag, Al and the like, a laminated layer of a titanium nitride film and a film containing aluminum as a main component, or a three-layer structure of a titanium nitride film, a film containing aluminum as a main component and a titanium nitride film. However, when adopting a material other than the light transmitting conductive oxides, the first electrode 6004 is formed thick enough to transmit light (preferably about 5 to 30 nm).

The second electrode 6006 is formed of a material or with a thickness to reflect or shield light. For example, metals, alloys, electrically conductive compounds or mixture of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals ($CaF_2$ or CaN), or rare-earth metals such as Yb and Er can be employed. When providing an electron injection layer, other conductive layers such as an Al layer can be employed as well.

The electroluminescent layer 6005 is formed to have a single or a plurality of layers. In the case of a plurality of layers, these layers may be classified into a hole injection layer, a hole transporting layer, a light emitting layer, an electron transporting layer, an electron injection layer and the like in terms of the carrier transporting properties. When the electroluminescent layer 6005 has, in addition to the light emitting layer, any of the hole injection layer, the hole transporting layer, the electron transporting layer and the electron injection layer, the hole injection layer, the hole transporting layer, the light emitting layer, the electron transporting layer and the electron injection layer are stacked in this order on the first electrode 6004. Note that the boundary of each layer is not necessarily distinct, and the boundary can not be distinguished clearly in some cases since the materials forming the respective layers are partially mixed into the adjacent layers. Each of the layers may be formed of an organic material or an inorganic material. As for the organic material, either of the high, medium or low molecular weight materials can be employed. Note that the medium molecular weight material means a low polymer in which the number of repeated structural unit (the degree of polymerization) is about 2 to 20. There is no clear distinction between the hole injection layer and the hole transporting layer, and both of them inevitably have a hole transporting property (hole mobility). The hole injection layer is in contact with the anode, and a layer in contact with the hole injection layer is distinguished as a hole transporting layer for convenience. The same applies to the electron transporting layer and the electron injection layer. A layer in contact with the cathode is called an electron injection layer while a layer in contact with the electron injection layer is called an electron transporting layer. The light emitting layer may combine the function of the electron transporting layer in some cases, and it is therefore called a light emitting electron transporting layer.

In the case of the pixel shown in FIG. 11A, light emitted from the light emitting element 6003 can be extracted from the first electrode 6004 side as shown by a hollow arrow.

FIG. 11B illustrates a cross-sectional diagram of a pixel in the case where a driving transistor 6011 and a current controlling transistor 6012 are both P-channel transistors and light emitted from a light emitting element 6013 is extracted from a second electrode 6016 side. Although FIG. 11B shows the structure in which a first electrode 6014 of the light emitting element 6013 is electrically connected to the current controlling transistor 6012, it may be electrically connected to the driving transistor 6011 as shown in the pixels in FIGS. 1B and 1D. On the first electrode 6014, an electroluminescent layer 6015 and the second electrode 6016 are stacked in this order.

The first electrode 6014 is formed of a material or with a thickness to reflect or shield light, which is also suitable for being used as an anode. For example, the first electrode 6014 may be formed of, a single-layer film of one or more of TiN, ZrN, Ti, W, Ni, Pt, Cr, Ag, Al and the like, a laminated layer of a titanium nitride film and a film containing aluminum as a main component, or a three-layer structure of a titanium nitride film, a film containing aluminum as a main component and a titanium nitride film.

The second electrode 6016 is formed of a material or with a thickness to transmit light. For example, metals, alloys, electrically conductive compounds or mixture of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals ($CaF_2$ or CaN), or rare-earth metals such as Yb and Er can be employed. When providing an electron injection layer, other conductive layers such as an Al layer can be employed as well. The second electrode 6016 is formed thick enough to transmit light (preferably about 5 to 30 nm). Note that the second electrode 6016 may be formed of indium tin oxide (ITO), zinc oxide (ZnO), indium zinc oxide (IZO), gallium-doped zinc oxide (GZO), or other light transmitting conductive oxides. Alternatively, the second electrode 6016 may be formed of a mixture of ITO, ITSO or indium oxide containing silicon oxide with zinc oxide (ZnO) of 2 to 20%. When adopting such light transmitting conductive oxides, the electroluminescent layer 6015 is preferably provided with an electron injection layer.

The electroluminescent layer 6015 can be formed similarly to the electroluminescent layer 6005 shown in FIG. 11A.

In the case of the pixel shown in FIG. 11B, light emitted from the light emitting element 6013 can be extracted from the second electrode 6016 side as shown by a hollow arrow.

FIG. 11C illustrates a cross-sectional diagram of a pixel in the case where a driving transistor 6021 and a current controlling transistor 6022 are both P-channel transistors, and light emitted from a light emitting element 6023 is extracted from both sides of a first electrode 6024 and a second electrode 6026. Although FIG. 11C illustrates the structure in which the first electrode 6024 of the light emitting element 6023 is electrically connected to the current controlling transistor 6022, it may be electrically connected to the driving transistor 6021 as shown in the pixels in FIGS. 1B and 1D. On the first electrode 6024, an electroluminescent layer 6025 and a second electrode 6026 are stacked in this order.

The first electrode 6024 may be formed similarly to the first electrode 6004 shown in FIG. 11A. The second electrode 6026 may be formed similarly to the second electrode 6016 shown in FIG. 11B. In addition, the electroluminescent layer 6025 may be formed similarly to the electroluminescent layer 6005 shown in FIG. 11A.

In the case of the pixel shown in FIG. 11C, light emitted from the light emitting element 6023 can be extracted from both sides of the first electrode 6024 and the second electrode 6024 as shown by hollow arrows.

Embodiment 4

Figure 12A:
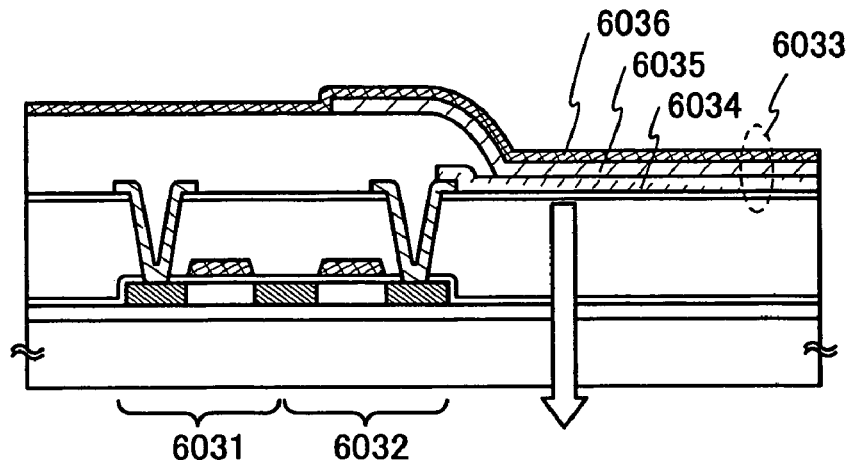
FIGS. 12A to 12C each illustrates a cross-sectional diagram of a pixel included in the light emitting device of the invention.
Figure 12B:
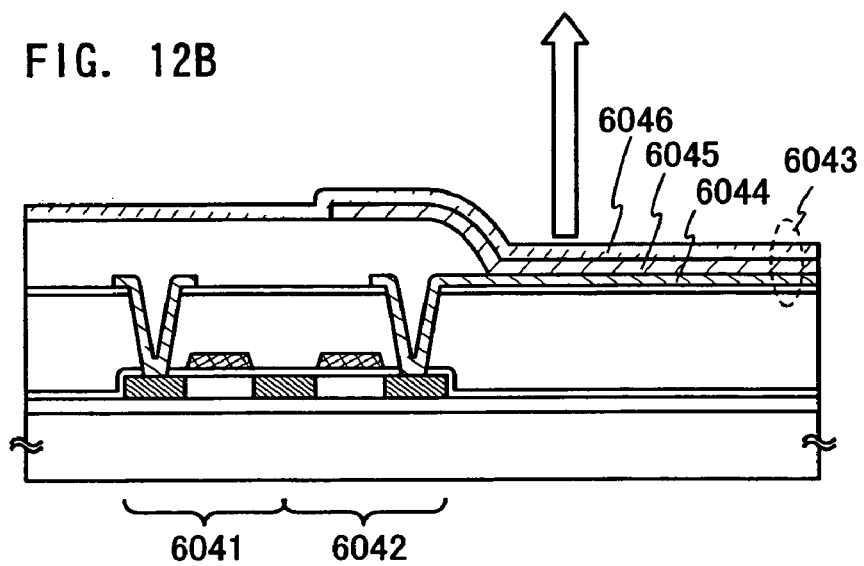
Figure 12C:
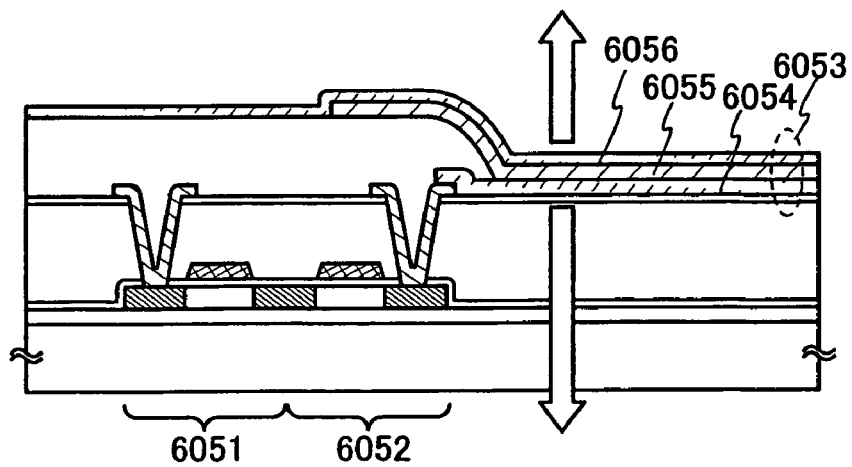

In this embodiment, description is made on the cross-sectional structure of a pixel in the case where the driving transistor is an N-channel transistor with reference to FIGS. 12A to 12C. Although FIGS. 12A to 12C each illustrates the case where the first electrode is a cathode while the second electrode is an anode, opposite structure may be employed such that the first electrode is an anode while the second electrode is a cathode.

FIG. 12A illustrates a cross-sectional diagram of a pixel in the case where a driving transistor 6031 and a current controlling transistor 6032 are both N-channel transistors and light emitted from a light emitting element 6033 is extracted from a first electrode 6034 side. Although FIG. 12A illustrates the structure in which the first electrode 6034 of the light emitting element 6033 is electrically connected to the current controlling transistor 6032, it may be electrically connected to the driving transistor 6031 as shown in the pixels in FIGS. 1B and 1D. On the first electrode 6034, an electroluminescent layer 6035 and a second electrode 6036 are stacked in this order.

The first electrode 6034 is formed of a material or with a thickness to transmit light. For example, metals, alloys, electrically conductive compounds or mixture of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals (CaF$_2$ or CaN), or rare-earth metals such as Yb and Er can be employed. When providing an electron injection layer, other conductive layers such as an Al layer can be employed as well. In such a case, the second electrode 6034 is formed thick enough to transmit light (preferably about 5 to 30 nm), and a light transmitting conductive layer may be formed by using a light transmitting conductive oxide so as to be in contact with the top or bottom surface of the aforementioned conductive layer having a thickness to transmit light, thereby suppressing sheet resistance of the first electrode 6034. Note that the first electrode 6034 may also be formed of indium tin oxide (ITO), zinc oxide (ZnO), indium zinc oxide (IZO), gallium-doped zinc oxide (GZO), or other light transmitting conductive oxides. Alternatively, the first electrode 6034 may be formed of a mixture of ITO, ITSO or indium oxide containing silicon oxide with zinc oxide (ZnO) of 2 to 20%. When adopting such light transmitting conductive oxides, the electroluminescent layer 6035 is preferably provided with an electron injection layer.

The second electrode 6036 is formed of a material or with a thickness to reflect or shield light, which is also suitable for being used as an anode. For example, the second electrode 6036 may be formed of a single-layer structure of one or more of TiN, ZrN, Ti, W, Ni, Pt, Cr, Ag, Al and the like, a two-layer structure of a titanium nitride film and a film containing aluminum as a main component, or a three-layer structure of a titanium nitride film, a film containing aluminum as a main component and a titanium nitride film.

The electroluminescent layer 6035 can be formed similarly to the electroluminescent layer 6005 shown in FIG. 11A. However, when the electroluminescent layer 6035 has, in addition to the light emitting layer, any of a hole injection layer, a hole transporting layer, an electron transporting layer and an electron injection layer, the electron injection layer, the electron transporting layer, the light emitting layer, the hole transporting layer and the hole injection layer are stacked in this order on the first electrode 6034.

In the pixel shown in FIG. 12A, light emitted from the light emitting element 6033 can be extracted from the first electrode 6034 side as shown by a hollow arrow.

FIG. 12B illustrates a cross-sectional diagram of a pixel in the case where a driving transistor 6041 and a current controlling transistor 6042 are both N-channel transistors and light emitted from a light emitting element 6043 is extracted from a second electrode 6046 side. Although FIG. 12B shows the structure in which a first electrode 6044 of the light emitting element 6043 is electrically connected to the current controlling transistor 6042, it may be electrically connected to the driving transistor 6041 as shown in the pixels in FIGS. 1B and 1D. On the first electrode 6044, an electroluminescent layer 6045 and the second electrode 6046 are stacked in this order.

The first electrode 6044 is formed of a material or with a thickness to reflect or shield light. For example, metals, alloys, electrically conductive compounds or mixture of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals (CaF$_2$ or CaN), or rare-earth metals such as Yb and Er can be employed. When providing an electron injection layer, other conductive layers such as an Al layer can be employed as well.

The second electrode 6046 is formed of a material or with a thickness to transmit light, which is also suitable for being used as an anode. For example, the second electrode 6046 may be formed of indium tin oxide (ITO), zinc oxide (ZnO), indium zinc oxide (IZO), gallium-doped zinc oxide (GZO), or other light transmitting conductive oxides. Alternatively, the second electrode 6046 may be formed of a mixture of ITO, ITSO or indium oxide containing silicon oxide with zinc oxide (ZnO) of 2 to 20%. Further, in addition to the aforementioned light transmitting conductive oxides, the second electrode 6046 may be formed of, for example, a single-layer structure of one or more of TiN, ZrN, Ti, W, Ni, Pt. Cr, Ag, Al and the like, a two-layer structure of a titanium nitride film and a film containing aluminum as a main component, or a three-layer structure of a titanium nitride film, a film containing aluminum as a main component and a titanium nitride film. However, when adopting a material other than the light transmitting conductive oxides, the second electrode 6046 is formed thick enough to transmit light (preferably about 5 to 30 nm).

The electroluminescent layer 6045 can be formed similarly to the electroluminescent layer 6035 shown in FIG. 12A.

In the case of the pixel shown in FIG. 12B, light emitted from the light emitting element 6043 can be extracted from the second electrode 6046 side as shown by a hollow arrow.

FIG. 12C illustrates a cross-sectional diagram of a pixel in the case where a driving transistor 6051 and a current controlling transistor 6052 are both N-channel transistors, and light emitted from a light emitting element 6053 is extracted from both sides of a first electrode 6054 and a second electrode 6056. Although FIG. 12C illustrates the structure in which the first electrode 6054 of the light emitting element 6053 is electrically connected to the current controlling transistor 6052, it may be electrically connected to the driving transistor 6051 as shown in the pixels in FIGS. 1B and 1D. On the first electrode 6054, an electroluminescent layer 6055 and a second electrode 6056 are stacked in this order.

The first electrode 6054 may be formed similarly to the first electrode 6034 shown in FIG. 12A. The second electrode 6056 may be formed similarly to the second electrode 6046 shown in FIG. 12B. In addition, the electroluminescent layer 6055 may be formed similarly to the electroluminescent layer 6035 shown in FIG. 12A.

In the case of the pixel shown in FIG. 12C, light emitted from the light emitting element 6053 can be extracted from both sides of the first electrode 6054 and the second electrode 6056 as shown by hollow arrows.

Embodiment 5

The light emitting device of the invention can be formed by using a printing method typified by screen printing and offset printing, or a droplet discharging method. The droplet discharging method is a method for forming a predetermined pattern by discharging droplets containing a predetermined composition from an orifice, and it includes an ink-jet printing method. When using such printing method or droplet discharging method, various wirings typified by a signal line, a scan line, a first power supply line and a second power supply line, a gate electrode of a TFT or an electrode of a light emitting element and the like can be formed. However, the printing method or the droplet discharging method is not necessarily used for the whole steps of forming patterns. Accordingly, such process is possible that wirings and a gate electrode are formed by a printing method or a droplet discharging method while a semiconductor film is patterned by lithography, in which case the printing method or the droplet discharging method are each used for a part of the steps, and lithography is combined. Further, a mask used for patterning may be formed by a printing method or a droplet discharging method.

Figure 13:
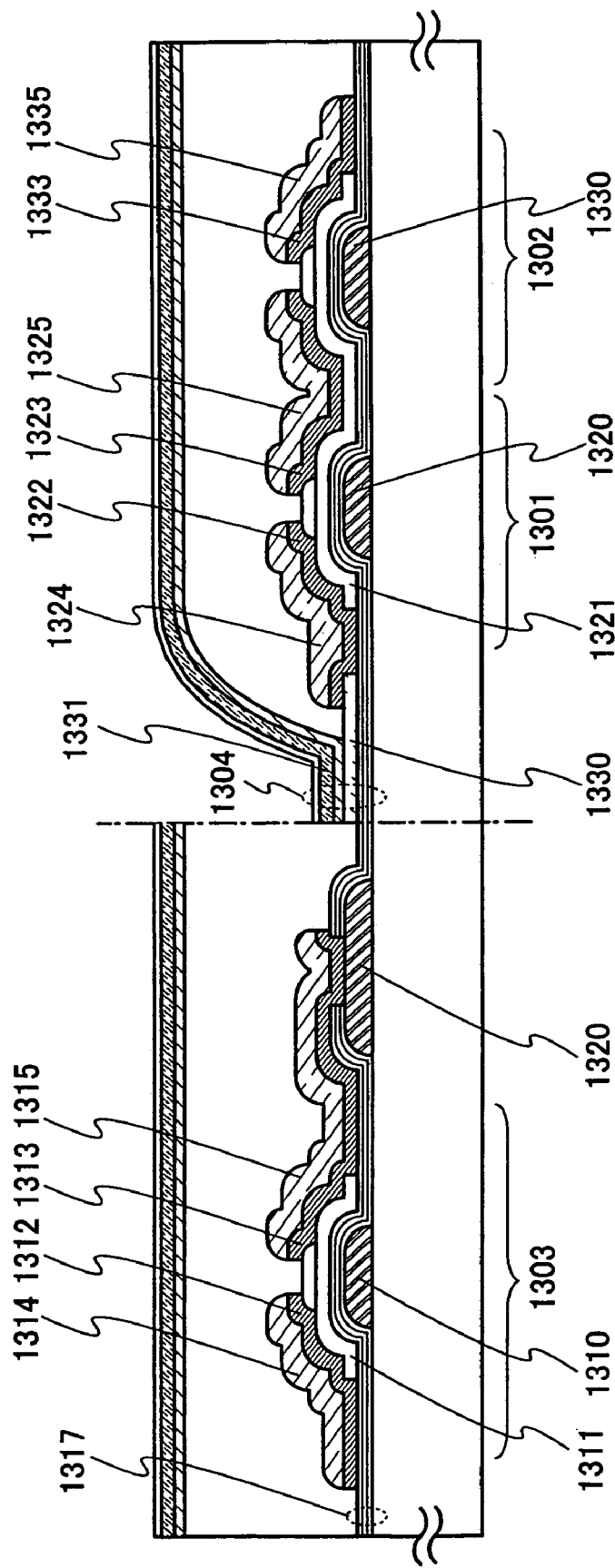
FIG. 13 is a cross-sectional diagram illustrating a pixel included in the light emitting device of the invention.

FIG. 13 illustrates an exemplary cross-sectional diagram of a light emitting device of the invention formed by using a droplet discharging method. In FIG. 13, reference numeral 1301 denotes a current controlling transistor, 1302 denotes a driving transistor, 1303 denotes a switching transistor and 1304 denotes a light emitting element. Note that FIG. 13 illustrates the structure in which the current controlling transistor 1301 is electrically connected to a first electrode 1330 of the light emitting element 1304, however, the invention is not limited to this structure. The driving transistor 1302 may be electrically connected to the first electrode 1330 of the light emitting element 1304. The driving transistor 1302 is desirably an N-channel transistor, in which case it is desirable that the first electrode 1330 be a cathode while a second electrode 1331 be an anode.

The switching transistor 1303 comprises a gate electrode 1310, a first semiconductor film 1311 including a channel formation region, a gate insulating film 1317 formed between the gate electrode 1310 and the first semiconductor film 1311, second semiconductor films 1312 and 1313 functioning as a source region or a drain region, a wiring 1314 connected to the second semiconductor film 1312, and a wiring 1315 connected to the second semiconductor film 1313.

The current controlling transistor 1301 comprises a gate electrode 1320, a first semiconductor film 1321 including a channel formation region, the gate insulating film 1317 formed between the gate electrode 1320 and the first semiconductor film 1321, second semiconductor films 1322 and 1323 functioning as a source region or a drain region, a wiring 1324 connected to the second semiconductor film 1322, and a wiring 1325 connected to the second semiconductor film 1323.

The driving transistor 1302 comprises a gate electrode 1330, the first semiconductor film 1321 including a channel formation region, the gate insulating film 1317 formed between the gate electrode 1330 and the first semiconductor film 1321, the second semiconductor films 1323 and 1333 functioning as a source region or a drain region, the wiring 1325 connected to the second semiconductor film 1323, and a wiring 1335 connected to the second semiconductor film 1333.

The wiring 1314 corresponds to a signal line, and the wiring 1315 is electrically connected to the gate electrode 1320 of the current controlling transistor 1301. The wiring 1335 corresponds to the first power supply line, and the gate electrode 1330 is electrically connected to the second power supply line though not shown.

By forming patterns using a droplet discharging method or a printing method, a series of steps such as lithography steps including photoresist coating, exposure and development, an etching step and a peeling step can be simplified. In addition, when adopting the droplet discharging method or the printing method, waste of materials that are removed by etching can be avoided differently from the case of adopting lithography. Further, since an expensive mask for exposure is not required, manufacturing cost of the light emitting device can be suppressed.

Further, differently from lithography, etching steps for forming wirings are not required. Accordingly, time required for formation steps of wirings can be significantly reduced as compared to the case of adopting lithography, In particular, when the wirings are formed with a thickness of 0.5 μm or more, and more preferably 2 μm or more, wiring resistance can be suppressed, therefore, time required for the manufacturing steps of the wiring can be suppressed while suppressing the increase of wiring resistance along with the enlargement of the light emitting device.

Note that each of the semiconductor films 1311 and 1321 may be either an amorphous semiconductor or a semi-amorphous semiconductor (SAS).

Amorphous semiconductor can be obtained by decomposing a silicon gas by glow discharge. As the typical silicon gas, $SiH_4$ or $Si_2H_6$ can be employed. The silicon gas may be diluted with hydrogen, or hydrogen and helium.

SAS can also be obtained by decomposing a silicon gas by glow discharge. As the typical silicon gas, $SiH_4$ can be used as well as other silicon gas such as $Si_2H_6$, $SiH_2Cl_2$, $SiHCl_3$, $SiCl_4$ and $SiF_4$. In addition, manufacture of the SAS can be facilitated when diluting the silicon gas with a mixed gas of hydrogen and a noble-gas, element selected from one or more of helium, argon, krypton and neon. The silicon gas is preferably diluted to a ratio of 2 to 1000 times. Further, the silicon gas may be mixed with a carbon gas such as $CH_4$ and $C_2H_6$, a germanium gas such as $GeH_4$ and $GeF_4$ or $F_2$ while the energy bandwidth may be controlled to be 1.5 to 2.4 eV or 0.9 to 1.1 eV. A TFT using an SAS as the first semiconductor layer can obtain the mobility of 1 to 10 $cm^2$/Vsec or more.

In addition, the first semiconductor films 1311 and 1321 may be formed of a semiconductor which is obtained by irradiating a semi-amorphous semiconductor (SAS) with laser.

Embodiment 6

Now, description is made on a compensation circuit having a different configuration from FIGS. 2 and 5.

Figure 15A:
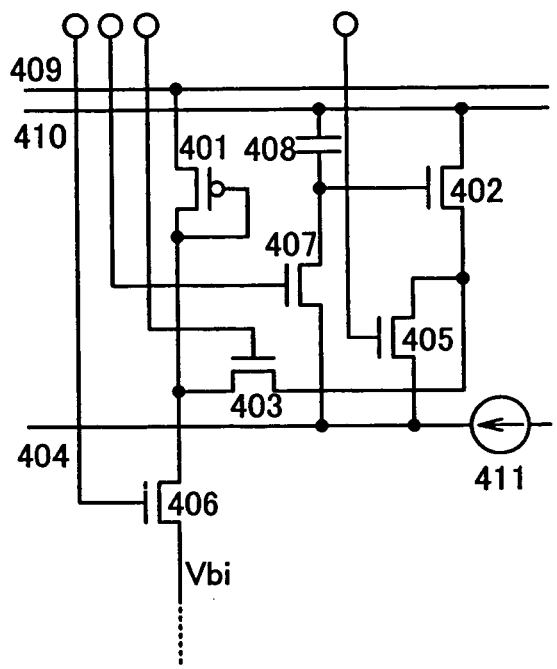
FIGS. 15A to 15C each illustrates a configuration of a pixel portion and a compensation circuit included in the light emitting device of the invention.

FIG. 15A illustrates a configuration of a compensation circuit of this embodiment. The compensation circuit of this embodiment comprises, correspondingly to the second power supply line Vbi (i=1 to x), a first compensation transistor 401 whose gate and the drain are connected to each other, a second compensation transistor 402 having the opposite conductivity to the first compensation transistor 401, a transistor 403 for controlling the connection between the drain of the second compensation transistor 402 and the drain and the gate of the first compensation transistor 401, a transistor 405 for controlling the connection between the drain of the second compensation transistor 402 and a third power supply line 404, a transistor 406 for controlling the connection between the second power supply line Vbi and the drain and the gate of the first compensation transistor 401, a transistor 407 for controlling the connection, between the gate of the second compensation transistor 402 and the third power supply line 404, and a capacitor 408 for holding the gate voltage of the second compensation transistor 402. The source of the first compensation transistor 401 is connected to a fourth power supply line 409 while the source of the second compensation transistor 402 is connected to a fifth power supply line 410.

Note that the transistor 406 is only required to control the current flowing between the fourth power supply line 409 and the second power supply line Vbi, therefore, it is not necessarily disposed between the drain of the second compensation transistor 402 and the second power supply line Vbi as shown in FIG. 15A. For example, the transistor 406 may be disposed between the fourth power supply line 409 and the source of the first compensation transistor 401.

The first compensation transistor 401 has the same conductivity as the driving transistor included in the pixel. In addition, the first compensation transistor 401 and the driving transistor desirably have the same characteristics such as the threshold voltage. Specifically, it is desirable that L/W ratios of the two transistors be substantially equal to each other.

It is most desirable that the fourth power supply line 409 be set at nearly an equal potential to the first power supply line for controlling the source potential of the driving transistor. This is because, when the fourth power supply line 409 is at an equal potential to the first power supply line, variations in the characteristics of the driving transistor can be accurately reflected on the potential compensation of the second power supply line Vbi. However, the fourth power supply line 409 is not necessarily required to be at the same potential as the first power supply line. The levels of the potentials may be determined by a designer optionally within the allowable range of accuracy for the compensation.

However, when the driving transistor and the first compensation transistor 401 are both P-channel transistors, the fourth power supply line 409 is set at a potential equal to or higher than the first power supply line. In addition, the first power supply line is set at a higher potential than the second electrode of the light emitting element. Specifically, the potential difference between the first power supply line and the second electrode of the light emitting element is set so as to allow a forward-bias current to be supplied to the light emitting element when both of the driving transistor and the current controlling transistor are ON.

On the other hand, when the driving transistors and the first compensation transistor 401 are both N-channel transistors, the fourth power supply line 409 is set at a potential equal to or lower than the first power supply line. In addition, the first power supply line is set at a higher potential than the second electrode of the light emitting element. Specifically, the potential difference between the first power supply line and the second electrode of the light emitting element is set so as to allow a forward-bias current to be supplied to the light emitting element when both of the driving transistor and the current controlling transistor are ON.

When the second compensation transistor 402 is an N-channel transistor, the fifth power supply line 410 is set at a lower potential than the fourth power supply line 409. On the other hand, when the second compensation transistor 402 is a P-channel transistor, the fifth power supply line 410 is set at a higher potential than the fourth power supply line 409.

The current flowing through the third power supply line 404 is controlled by a constant current source 411.

Note that the each of the transistor 403, the transistor 405, the transistor 406 and the transistor 407 may be either an N-channel transistor or a P-channel transistor.

Now, description is made on the operation of the compensation circuit shown in FIG. 15A. Note that FIGS. 15B and 15C each illustrates the transistor 403, the transistor 406, the transistor 406 and the transistor 407 merely as switches for ease of description.

Figure 15B:
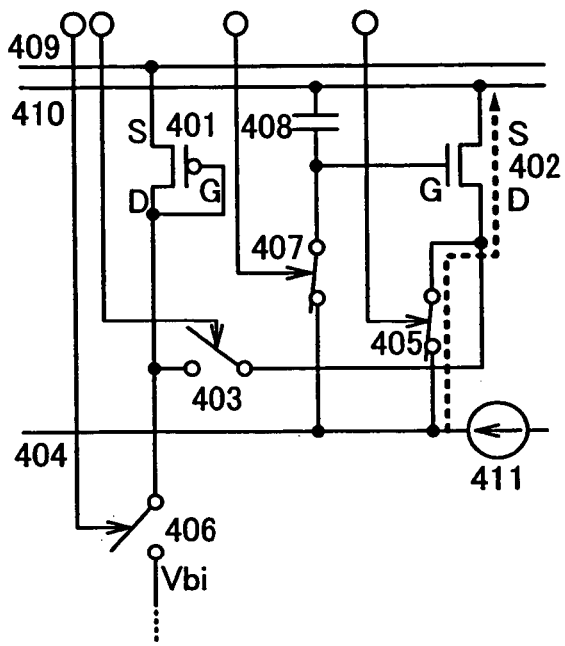

First, as shown in FIG. 15B, the transistor 405 and the transistor 407 are turned ON while the transistor 403 and the transistor 406 are turned OFF. Then, a constant current I flows between the fifth power supply line 410 and the third power supply line 404 by using a constant current source 411. The constant current I corresponds to a drain current of the second compensation transistor 402. Note that since the transistor 405 and the transistor 407 are ON, the gate and the drain of the second compensation transistor 402 are connected, and thus it operates in the saturation region. Therefore, the second compensation transistor 402 operates so as to satisfy the aforementioned Formula 1. It is ascertained from Formula 1 that the gate voltage Vgs of the second compensation transistor 402 is determined by the current L. The gate voltage Vgs of the second compensation transistor 402 is held by the capacitor 408.

Figure 15C:
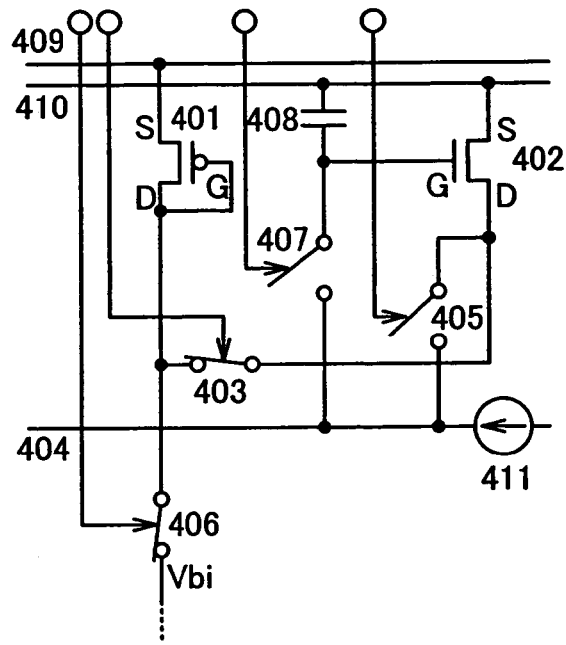

Next, the transistor 405 and the transistor 407 are turned OFF while the transistor 403 and the transistor 406 are turned ON as shown in FIG. 15C. The transistor 407 is preferably turned OFF prior to the transistor 405 since it can suppress the fluctuation of the voltage held in the capacitor 408.

By turning OFF the transistor 405 and the transistor 407 while turning ON the transistor 403 and the transistor 406, a current flows between the fourth power supply line 409 and the fifth power supply line 410 through the first compensation transistor 401, the transistor 403 and the second compensation transistor 402. The current flowing between the fourth power supply line 409 and the fifth power supply line 410 is determined by the gate voltage of the first compensation transistor 401 held in the capacitor 408. That is, a current as large as the drain current I of the second compensation transistor 402 which is controlled by the constant current source 411 flows between the fourth power supply line 409 and the fifth power supply line 410 as shown in FIG. 15C.

Since the gate and the drain of the first compensation transistor 401 are connected, it operates in the saturation region. Accordingly, the gate voltage of the first compensation transistor 401 is set to have a corresponding value to the current I flowing between the fourth power supply line 409 and the fifth power supply line 410. In addition, since the transistor 406 is ON, the first compensation transistor 401 and the driving transistor have the same gate voltage Vgs in the case where the fourth power supply line 409 and the first power supply line are at the same potential. Accordingly, the gate voltage Vgs of the first compensation transistor 401 determined by the current I has the same level as the gate voltage Vgs of the driving transistor.

Accordingly, when the compensation transistor 401 and the driving transistor have similar characteristics, specifically such as $\mu C_0 W/L$ and the threshold voltage Vth, the drain current of the driving transistor can have nearly the same value as the drain current I of the compensation transistor 401 when the current controlling transistor is ON. Accordingly, luminance variations of the light emitting element can be suppressed even when the characteristics of the driving transistor in the pixel portion vary.

Note that the compensation circuit shown in FIG. 15A can operate in parallel with the operation of the pixel.

In the case of adopting the compensation circuit shown in this embodiment, the potential of the second power supply line can be compensated constantly differently from the compensation circuits shown in FIGS. 2 and 5. Therefore, even when, for example, the source potential or the drain potential of the driving transistor fluctuates due to the switching operation of the current controlling transistor, the potential fluctuation of the second power supply line Vbi can be suppressed.

Embodiment 7

Now, description is made on the compensation circuit having a different configuration from FIGS. 2, 5 and FIGS. 15A to 15C.

Figure 18A:
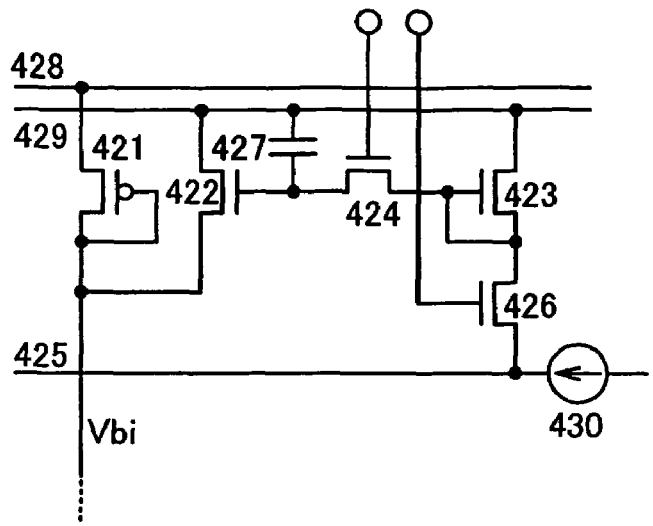
FIGS. 18A to 18C each illustrates a configuration of a compensation circuit included in the light emitting device of the invention.

FIG. 18A illustrates a configuration of a compensation circuit of this embodiment. The compensation circuit of this embodiment comprises, correspondingly to the second power supply line Vbi (i=1 to x), a first compensation transistor 421 whose gate and drain are connected to each other, a second compensation transistor 422 having the opposite conductivity to the first compensation transistor 421, a third compensation transistor 423, a transistor 424 for controlling the connection between the gate of the second compensation transistor 422 and the gate and the drain of the third compensation transistor 423, a transistor 426 for controlling the connection between a third power supply line 425 and the gate and the drain of the third compensation transistor 423, a and a capacitor 427 for holding the gate voltage of the third compensation transistor 423. The source of the first compensation transistor 421 is connected to a fourth power supply line 428 while the source of the second compensation transistor 422 is connected to a fifth power supply line 429. The gate and the drain of the third compensation transistor 423 are connected.

The current flowing through the third power supply line 425 is controlled by a constant current source 430.

The first compensation transistor 421 has the same conductivity as the driving transistor included in the pixel. The first compensation transistor 421 and the driving transistor desirably have the same characteristics such as the threshold voltage. Specifically, it is desirable that L/W ratios of the two transistors be substantially equal to each other. In addition, the second compensation transistor 422 and the third compensation transistor 423 desirably have the same characteristics such as the threshold voltage. Specifically, it is desirable that L/W ratios of the two transistors be substantially equal to each other.

It is most desirable that the fourth power supply line 428 be set at nearly an equal potential to the first power supply line for controlling the source potential of the driving transistor. This is because, when the fourth power supply line 428 is at an equal potential to the first power supply line, characteristic variations of the driving transistor can be accurately reflected on the potential compensation of the second power supply line Vbi. However, the fourth power supply line 428 is not necessarily required to be at the same potential as the first power supply line. The levels of the potentials may be determined by a designer optionally within the allowable range of accuracy for the compensation.

However, when the driving transistor and the first compensation transistor 421 are both P-channel transistors, the fourth power supply line 428 is set at a potential equal to or higher than the first power supply line. In addition, the first power supply line is set at a higher potential than the second electrode of the light emitting element. Specifically, the potential difference between the first power supply line and the second electrode of the light emitting element is set so as to allow a forward-bias current to be supplied to the light emitting element when both of the driving transistor and the current controlling transistor are ON.

On the other hand, when the driving transistor and the first compensation transistor 421 are both N-channel transistors, the fourth power supply line 428 is set at a potential equal to or lower than the first power supply line. In addition, the first power supply line is set at a lower potential than the second electrode of the light emitting element. Specifically, the potential difference between the first power supply line and the second electrode of the light emitting element is set so as to allow a forward-bias current to be supplied to the light emitting element when both of the driving transistor and the current controlling transistor are ON.

When the second compensation transistor 422 and the third compensation transistor 423 are both N-channel transistors, the fifth power supply line 429 is set at a lower potential than the fourth power supply line 428. On the other hand, when the second compensation transistor 422 and the third compensation transistor 423 are both P-channel transistors, the fifth power supply line 429 is set at a higher potential than the fourth power supply line 428. In either case, the potential difference between the fourth power supply line 428 and the fifth power supply line 429 is set so as to allow the second compensation transistor 422 to operate in the saturation region.

Note that the each of the transistor 424 and the transistor 426 may be either an N-channel transistor or a P-channel transistor.

Now, description is made on the operation of the compensation circuit shown in FIG. 18A. Note that FIGS. 18B and 18C each illustrates the transistor 424 and the transistor 426 merely as switches for ease of description.

Figure 18B:
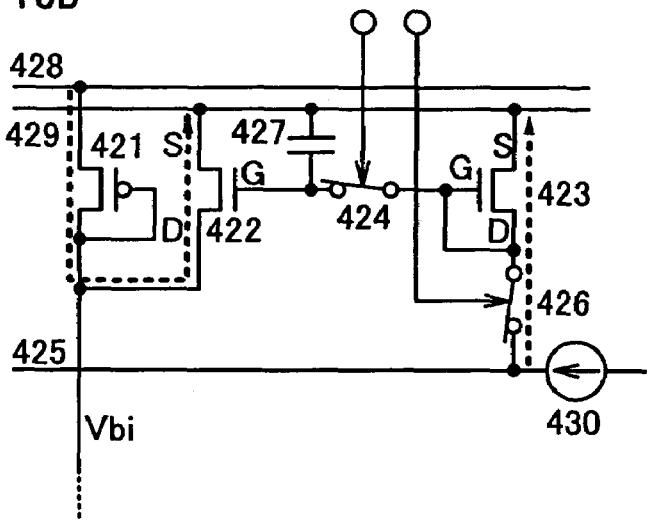

First, as shown in FIG. 18B, the transistor 424 and the transistor 426 are turned ON. Then, a constant current I flows between the fifth power supply line 429 and the third power supply line 425 by using a constant current source 430. The constant current I corresponds to a drain current of the third compensation transistor 423. Note that since the gate and the drain of the third compensation transistor 423 are connected, it operates in the saturation region. Therefore, the third compensation transistor 423 operates so as to satisfy the aforementioned Formula 1. It is ascertained from Formula 1 that the gate voltage Vgs of the third compensation transistor 423 is determined by the current I. The gate voltage Vgs of the third compensation transistor 423 is held by the capacitor 427.

Meanwhile, since the gates and the sources of the second compensation transistor 422 and the third compensation transistor 423 are connected respectively, the gate voltage of the second compensation transistor 422 has the same level as the gate voltage of the third compensation transistor 423. Accordingly, when the second compensation transistor 422 and the third compensation transistor 423 have similar characteristics, the drain current of the second compensation transistor 422 can have nearly the same value as the drain current I of the third compensation transistor 423.

The drain current of the second compensation transistor 422 flows between the fourth power supply line 428 and the fifth power supply line 429. Accordingly, the drain current of the first compensation transistor 421 has the same value as the drain current of the second compensation transistor 422. That is, the drain current I of the third compensation transistor 423 controlled by the constant current source 430 has the same value as the drain current of the first compensation transistor 421.

Since the gate and the source of the first compensation transistor 421 are connected, it operates in the saturation region. Accordingly, the gate voltage of the first compensation transistor 421 is set to have a corresponding value to the drain current I. In addition, when the fourth power supply line 428 is at the same potential as the first power supply line, the first compensation transistor 421 and the driving transistor have the same gate voltage Vgs. Accordingly, the gate voltage Vgs of the first compensation transistor 421 determined by the current I has the same level as the gate voltage Vgs of the driving transistor.

Figure 18C:
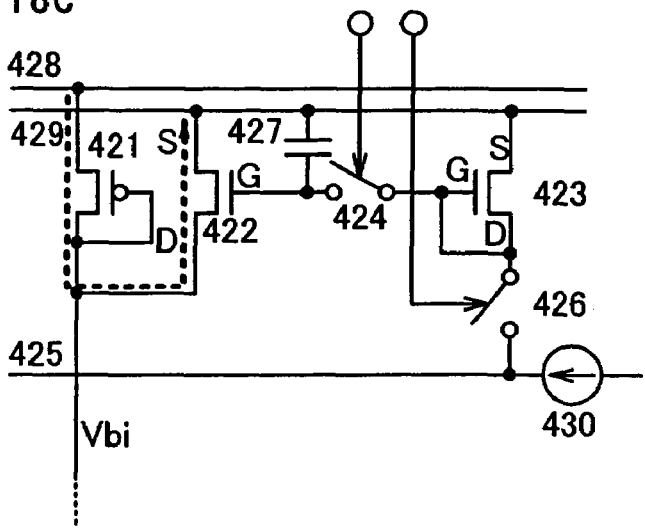

Next, the transistor 424 and the transistor 426 are turned OFF as shown in FIG. 18C. The transistor 424 is preferably turned OFF prior to the transistor 426 since it can suppress the fluctuation of the voltage held in the capacitor 427. Even when the transistor 424 and the transistor 426 are turned OFF, the gate voltage of the second compensation transistor is held, therefore, the potential of the second power supply line Vbi can be held.

Note that the compensation circuit shown in FIG. 18A can operate in parallel with the operation of the pixel.

In the compensation circuit shown in this embodiment, when the first compensation transistor 421 and the driving transistor have similar characteristics, specifically such as $\mu C_0 W/L$ and the threshold voltage Vth, the drain current of the driving transistor can have nearly the same value as the drain current I of the first compensation transistor 421 when the current controlling transistor is ON. Accordingly, luminance variations of the light emitting element can be suppressed even when the characteristics of the driving transistor in the pixel portion vary.

In the case of adopting the compensation circuit shown in this embodiment, the potential of the second power supply line can be compensated constantly differently from the compensation circuits shown in FIGS. 2 and 5. Therefore, even when, for example, the source potential and the drain potential of the driving transistor fluctuates due to the switching operation of the current controlling transistor, the potential fluctuation of the second power supply line Vbi can be suppressed.

Embodiment 8

In this embodiment, description is made on the exterior view of a panel which corresponds to one mode of a light emitting device of the invention with reference to FIGS. 14A and 14B. FIG. 14A illustrates a top plan view of a panel obtained by sealing a first substrate over which transistors and light emitting elements are formed and a second substrate with a sealant. FIG. 14B illustrates a cross-sectional diagram of FIG. 14A along a line A-A'.

A sealant 4005 is provided so as to surround a pixel portion 4002, a signal line driver circuit 4003, a scan line driver circuit 4004 and a compensation circuit 4020 formed over a first substrate 4001. In addition, a second substrate 4006 is provided over the pixel portion 4002, the signal line driver circuit 4003, the scan line driver circuit 4004 and the compensation circuit 4020. Accordingly, the pixel portion 4002, the signal line driver circuit 4003, the scan line driver circuit 4004 and the compensation circuit 4020 are tightly sealed together with a filler 4007 by the first substrate 4001, the sealant 4005 and the second substrate 4006.

Each of the pixel portion 4002, the signal line driver circuit 4003, the scan line driver circuit 4004 and the compensation circuit 4020 formed over the first substrate 4001 has a plurality of transistors. FIG. 14B illustrates a transistor 4008 included in the signal line driver circuit 4003, a current controlling transistor 4010 and a driving transistor 4009 included in the pixel portion, and a compensation transistor 4030 included in the compensation circuit 4020.

Reference numeral 4011 corresponds to a light emitting element, and a first electrode thereof is electrically connected to the drain of the driving transistor 4009 through a wiring 4017. In this embodiment, a second electrode of the light emitting element 4011 is electrically connected to a light transmitting conductive film 4012. Note that the structure of the light emitting element 4011 is not limited to the one shown in this embodiment. The structure of the light emitting element 4011 can be appropriately changed in accordance with the direction of light emitted from the light emitting element 4011 and the conductivity of the driving transistor 4009.

Although the current controlling transistor 4010 is connected to the first electrode of the light emitting element 4011 in this embodiment, the driving transistor 4009 may be connected to the first electrode of the light emitting element 4011.

Various signals and potentials supplied to the signal line driver circuit 4003, the scan line driver circuit 4004 or the pixel portion 4002 are not shown in the cross-sectional diagram in FIG. 14B, however, they are supplied from a connecting terminal 4016 through lead wirings 4014 and 4015.

In this embodiment, the connecting terminal 4016 is formed of the same conductive film as the first electrode of the light emitting element 4011. The lead wiring 4014 is formed of the same conductive film as the wiring 4017. The lead wiring 4015 is formed of the same conductive film as the respective gate electrodes of the driving transistor 4009 and the transistor 4008.

The connecting terminal 4016 is electrically connected to a terminal of an FPC 4018 through an anisotropic conductive film 4019.

Note that each of the first substrate 4001 and the second substrate 4006 may be formed of glass, metal (typically, stainless), ceramics, plastics and the like. As for the plastic, an FRP (Fiberglass-Reinforced Plastics) substrate, an RVF (Polyvinylfluoride) film, a mylar film, a polyester film or an acrylic resin film can be employed. In addition, a sheet having a structure that aluminum is sandwiched by a PVF film and a mylar film can be employed.

Note that the second substrate 4006 is required to transmit light since it is disposed on the side from which light emitted from the light emitting element 4011 is extracted. In this case, light transmitting materials are employed such as a glass substrate, a plastic substrate, a polyester film or an acrylic film.

As for the filler 4007, inert gas such as a nitrogen gas and an argon gas, an ultraviolet curable resin or a heat curable resin can be used as well as PVC (polyvinyl chloride), acrylic, polyimide, an epoxy resin, a silicone resin, PVB (polyvinyl butyral) or EVA (ethylene vinyl acetate). In this embodiment, a nitrogen gas is employed as the filler.

This embodiment can be appropriately implemented in combination with any of Embodiments 1 to 7.

Embodiment 9

Since a light emitting device of the invention can suppress luminance variations between pixels, it can be suitably applied to an electronic device having a display portion for image display such as a display device and a goggle display.

Further, the light emitting device of the invention can be applied to such devices as a video camera, a digital camera, a goggle display (head mounted display), a navigation system, a sound reproducing device (car audio, component stereo set and the like), a notebook personal computer, a game machine, a portable information terminal (mobile computer, portable phone, portable game machine, electronic book and the like), an image reproducing device equipped with a recording medium (typically, a device reproducing a recording medium such as a DVD: Digital Versatile Disk, and having a display for displaying the reproduced image). Specific examples of such electronic devices are shown in FIGS. 16A to 16C.

Figure 16A:
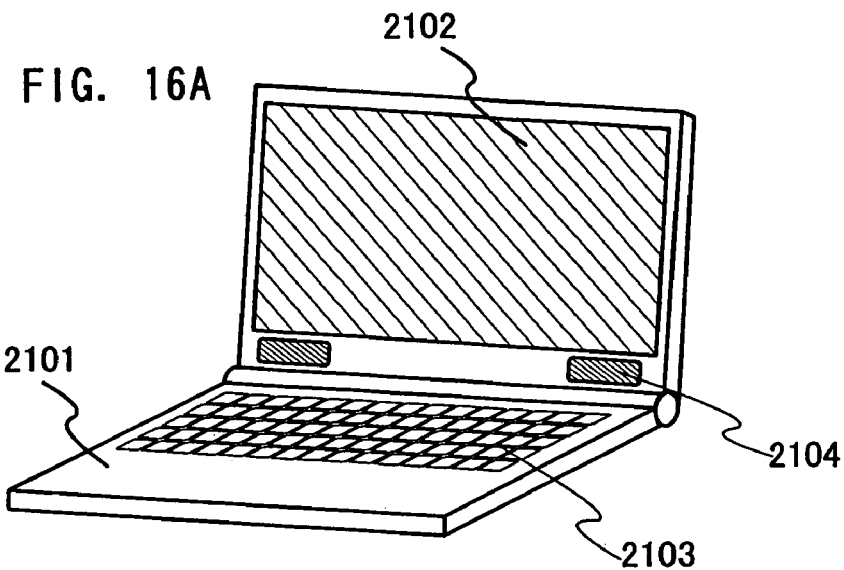
FIGS. 16A to 16C each illustrates an electronic device formed by using the light emitting device of the invention.

FIG. 16A illustrates a portable information terminal (PDA) which includes a main body 2101, a display portion 2102, an operating key 2103, a speaker portion 2104 and the like. The light emitting device of the invention can be applied to the display portion 2102.

Figure 16B:
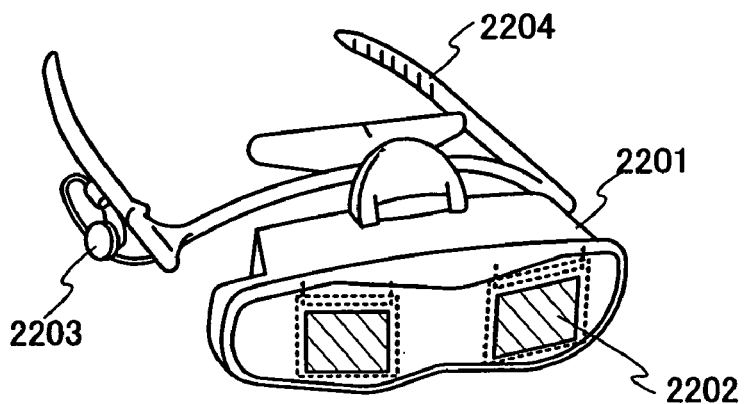

FIG. 16B illustrates a goggle display device which includes a main body 2201, a display portion 2202, an earphone 2203, a supporting portion 2204 and the like. The light emitting device of the invention can be applied to the display portion 2202. The supporting portion 2204 may be of a type for fixing the goggle display device on the user's head or a type for fixing it on other portions of user's body other than the head.

Figure 16C:
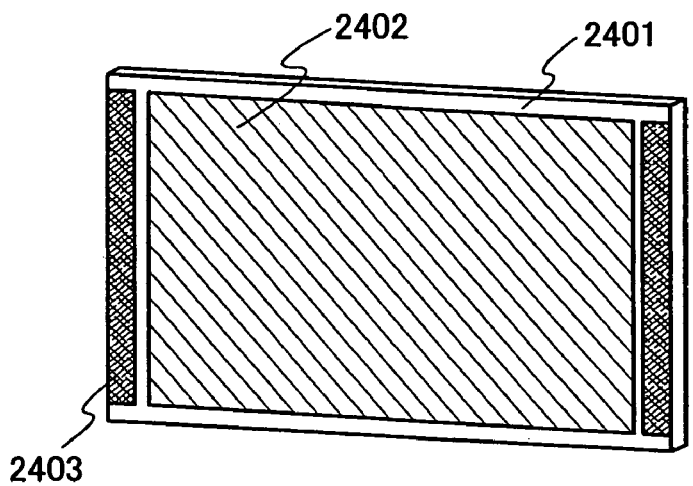

FIG. 16C illustrates a display device which includes a housing 2402, a display portion 2402, a speaker portion 2403 and the like. The light emitting device of the invention can be applied to the display portion 2402. Since the light emitting device is of a self-luminous type, no backlight is required, and thinner display portion than that of liquid crystal displays can be obtained. Note that the display device includes all information display devices for personal computer, for TV broadcast reception, for advertisement display and the like. In the case of adopting the light emitting device for the display device, a polarizer may be provided in order to prevent that images are displayed like mirror images due to the external light reflected on the first electrode or the second electrode.

As set forth above, the application range of the invention is so wide that it can be applied to electronic devices of various fields. In addition, the electronic devices of this embodiment may adopt any of the structures shown in Embodiments 1 to 8.

What is claimed is:

1. A light emitting device comprising:
    a plurality of pixels, each of the plurality of pixels comprising:
        a light emitting element;
        a first transistor for determining a current value supplied to the light emitting element;
        a second transistor for selecting emission or non-emission of the light emitting element according to a video signal; and
        a first power supply line,
    wherein the plurality of pixels share a second power supply line;
    a compensation circuit comprising:
        a third transistor having a gate and a drain electrically connected to each other,
        a fourth transistor for controlling the connection between a third power supply line and the gate and the drain of the third transistor; and
        a fifth transistor for controlling supply of a drain current of the third transistor to the second power supply line,
    wherein the first transistor and the second transistor are connected in series between the light emitting element and the first power supply line; and
    wherein a gate of the first transistor is connected to the second power supply line.

2. The light emitting device according to claim 1, wherein the first transistor and the third transistor have the same conductivity.

3. The light emitting device according to claim 1, wherein a ratio of the channel length to the channel width of the first transistor is larger than that of the second transistor.

4. A light emitting device comprising:
    a plurality of pixels, each of the plurality of pixels comprising:
        a light emitting element;
        a first transistor for determining a current value supplied to the light emitting element;
        a second transistor for selecting emission or non-emission of the light emitting element according to a video signal; and
        a first power supply line;
    wherein the plurality of pixels share a second power supply line;
    a compensation circuit comprising:
        a third transistor having a gate and a drain electrically connected to each other,
        a fourth transistor for controlling the electrically connection between a third power supply line and the gate and the drain of the third transistor; and
        a fifth transistor for controlling supply of a drain current of the third transistor to the second power supply line,
    wherein the first transistor and the second transistor are connected in series between the light emitting element and the first power supply line;
    wherein a gate of the first transistor is connected to the second power supply line;
    wherein an active layer of the first transistor and an active layer of the third transistor are crystallized by laser light; and
    wherein the active layer of the first transistor and the active layer of the third transistor are located within the same beam spot of the laser light.

5. The light emitting device according to claim 4, wherein the first transistor and the third transistor have the same conductivity.

6. The light emitting device according to claim 4, wherein a ratio of the channel length to the channel width of the first transistor is larger than that of the second transistor.

7. A light emitting device comprising:
    a plurality of pixels, each of the plurality of pixels comprising:
        a light emitting element;

a first transistor for determining a current value supplied to the light emitting element;

a second transistor for selecting emission or non-emission of the light emitting element according to a video signal;

a third transistor for controlling an input of the video signal to each of the plurality of pixels; and a first power supply line, wherein the plurality of pixels share a second power supply line;

a compensation circuit comprising:

a fourth transistor having a gate and a drain electrically connected to each other;

a fifth transistor for controlling the connection between a third power supply line and the gate and the drain of the fourth transistor; and a sixth transistor for controlling supply of a drain current of the fourth transistor to the second power supply line;

wherein the first transistor and the second transistor are connected in series between the light emitting element and the first power supply line; and wherein a gate of the first transistor is connected to the second power supply line.

8. The light emitting device according to claim 7, wherein the first transistor and the fourth transistor have the same conductivity.

9. The light emitting device according to claim 7, further comprising a seventh transistor for controlling the connection between a gate of the second transistor and the first power supply line irrespective of a potential of the video signal.

10. The light emitting device according to claim 7, wherein a ratio of the channel length to the channel width of the first transistor is larger than that of the second transistor.

11. A light emitting device comprising:

a plurality of pixels, each of the pixels comprising:

a light emitting element;

a first transistor for determining a current value supplied to the light emitting element;

a second transistor for selecting emission or non-emission of the light emitting element according to a video signal;

a third transistor for controlling an input of the video signal to each of the plurality of pixels; and a first power supply line, wherein the plurality of pixels share a second power supply line;

a compensation circuit comprising:

a fourth transistor having a gate and a drain electrically connected to each other;

a fifth transistor for controlling the connection between a third power supply line and the gate and the drain of the fourth transistor; and a sixth transistor for controlling supply of a drain current of the fourth transistor to the second power supply line;

wherein the first transistor and the second transistor are connected in series between the light emitting element and the first power supply line;

wherein a gate of the first transistor is connected to the second power supply line;

wherein an active layer of the first transistor and an active layer of the fourth transistor are crystallized by laser light; and wherein the active layer of the first transistor and the active layer of the fourth transistor are located within the same beam spot of the laser light.

12. The light emitting device according to claim 11, wherein the first transistor and the fourth transistor have the same conductivity.

13. The light emitting device according to claim 11, further comprising a seventh transistor for controlling the connection between a gate of the second transistor and the first power supply line irrespective of a potential of the video signal.

14. The light emitting device according to claim 11, wherein a ratio of the channel length to the channel width of the first transistor is larger than that of the second transistor.

* * * * *